US012719022B2

(12) United States Patent
Park et al.

(10) Patent No.: US 12,719,022 B2
(45) Date of Patent: Aug. 25, 2026

(54) FAST FREQUENCY TRACKING CONTROL FOR RADIOFREQUENCY POWER AMPLIFIERS WITH RAPIDLY CHANGING PLASMA LOADS

(71) Applicants: Lam Research Corporation, Fremont, CA (US); Advanced Energy Industries, Inc., Denver, CO (US)

(72) Inventors: Sanghyeon Park, Sunnyvale, CA (US); Wei Liang, San Jose, CA (US)

(73) Assignees: Lam Research Corporation, Fremont, CA (US); Advanced Energy Industries, Inc., Denver, CO (US)

(*) Notice: Subject to any disclaimer, the term of this patent is extended or adjusted under 35 U.S.C. 154(b) by 48 days.

(21) Appl. No.: 18/879,237

(22) PCT Filed: Jul. 10, 2023

(86) PCT No.: PCT/US2023/027275
§ 371 (c)(1),
(2) Date: Dec. 26, 2024

(87) PCT Pub. No.: WO2024/015304
PCT Pub. Date: Jan. 18, 2024

(65) Prior Publication Data

US 2025/0218726 A1 Jul. 3, 2025

Related U.S. Application Data

(60) Provisional application No. 63/388,545, filed on Jul. 12, 2022.

(51) Int. Cl.
*H01J 37/32* (2006.01)
*H03F 1/56* (2006.01)
(Continued)

(52) U.S. Cl.
CPC ... *H01J 37/32183* (2013.01); *H01J 37/32119* (2013.01); *H01J 37/32935* (2013.01);
(Continued)

(58) Field of Classification Search
CPC .......... H01J 37/32183; H01J 37/32119; H01J 37/32935; H01J 37/3299;
(Continued)

(56) References Cited

U.S. PATENT DOCUMENTS 10,515,781 B1 * 12/2019 Long ................ H01J 37/32155
2019/0157041 A1 5/2019 Zyl et al.
(Continued)

FOREIGN PATENT DOCUMENTS

JP 2021527379 A 10/2021
WO 2006124734 A1 11/2006

OTHER PUBLICATIONS

PCT Application No. PCT/US2023/027275, International Search Report and Written Opinion of the International Searching Authority, Mailed Nov. 2, 2023, 8 pages.

*Primary Examiner* — Henry Luong
(74) *Attorney, Agent, or Firm* — Polygon IP, LLP

(57) ABSTRACT

A radiofrequency (RF) power amplifier for a plasma processing system includes a switching transistor having a drain terminal, a source terminal, and a gate. The source terminal is connected to a reference ground potential. The RF power amplifier includes a direct current power supply connected to the drain terminal of the switching transistor. The RF power amplifier includes an impedance matching network connected between the drain terminal of the switching transistor and a coil of the plasma processing system. The RF power amplifier includes an electrical parameter measurement device disposed to measure an electrical parameter related to the coil. The RF power amplifier includes a phase
(Continued)

delay module that receives a switching feedback signal from the electrical parameter measurement device. The phase delay module applies a phase adjustment to the switching feedback signal to generate a switching control signal that is used to drive the gate of the switching transistor.

20 Claims, 11 Drawing Sheets

(51) Int. Cl.
*H03F 3/24* (2006.01)
*H03L 7/081* (2006.01)

(52) U.S. Cl.
CPC .......... *H01J 37/3299* (2013.01); *H03F 1/565* (2013.01); *H03F 3/245* (2013.01); *H01J 2237/24564* (2013.01); *H03F 2200/451* (2013.01); *H03L 7/0812* (2013.01)

(58) Field of Classification Search
CPC H01J 2237/24564; H03F 1/565; H03F 3/245; H03F 2200/451; H03L 7/0812
See application file for complete search history.

(56) References Cited

U.S. PATENT DOCUMENTS

| | | | |
|---|---|---|---|
| 2020/0411288 | A1 | 12/2020 | Wang et al. |
| 2021/0407771 | A1 | 12/2021 | Funk et al. |

* cited by examiner

FAST FREQUENCY TRACKING CONTROL FOR RADIOFREQUENCY POWER AMPLIFIERS WITH RAPIDLY CHANGING PLASMA LOADS

This application is a national stage filing of and claims priority, under 35 U.S.C. § 371, to PCT/US2023/027275, filed on Jul. 10, 2023, which claims the benefit of U.S. Provisional Application No. 63/388,545, filed on Jul. 12, 2022. The entire disclosure of each application referenced above is incorporated herein by reference.

BACKGROUND

Plasma processing systems are used to manufacture semiconductor devices, e.g., chips/die, on semiconductor wafers. In the plasma processing system, the semiconductor wafer is exposed to various types of plasma to cause prescribed changes to a condition of the semiconductor wafer, such as through material deposition and/or material removal and/or material implantation and/or material modification, etc. During plasma processing of the semiconductor wafer, radiofrequency (RF) power is transmitted through a process gas within a chamber to transform the process gas into the plasma in exposure to the semiconductor wafer. Reactive constituents of the plasma, such as radicals and ions, interact with materials on the semiconductor wafer to achieve a prescribed effect on the semiconductor wafer. In some plasma processing systems, RF power is transmitted from an antenna or coil through a window, e.g., an RF transparent ceramic structure, to the processing region within the chamber in order to transform the process gas into the plasma in exposure to the semiconductor wafer. It is within this context that various embodiments described herein arise.

SUMMARY

In an example embodiment, an RF power amplifier for a plasma processing system is disclosed. The RF power amplifier includes a switching transistor having a drain terminal, a source terminal, and a gate. The source terminal is electrically connected to a reference ground potential. The RF power amplifier also includes a direct current (DC) power supply electrically connected to the drain terminal of the switching transistor. The RF power amplifier also includes an impedance matching network electrically connected between the drain terminal of the switching transistor and a coil of the plasma processing system. RF power amplifier also includes an electrical parameter measurement device disposed to measure an electrical parameter related to the coil. RF power amplifier also includes a phase delay module having an input electrically connected to receive a switching feedback signal from the electrical parameter measurement device. The phase delay module is configured to apply a phase adjustment to the switching feedback signal to generate a switching control signal. The phase delay module has an output electrically connected to the gate of the switching transistor. The phase delay module is configured to convey the switching control signal through the output of the phase delay module to the gate of the switching transistor.

In an example embodiment, a method is disclosed for zero voltage switching of an RF power amplifier for a plasma processing system. The method includes operating a switching transistor, a direct current power supply, and an impedance matching network to generate an RF signal. The method also includes conveying the RF signal to a coil of the plasma processing system. The method also includes measuring an electrical parameter related to the coil. The method also includes conveying a switching feedback signal based on the measured electrical parameter to an input of a phase delay module. The method also includes generating a switching control signal within the phase delay module by applying a phase adjustment to the switching feedback signal. The method also includes conveying the switching control signal to a gate of the switching transistor for controlling operation of the switching transistor and corresponding generation of the RF signal that is conveyed to the coil.

Other aspects and advantages of the embodiments disclosed herein will become more apparent from the following detailed description and the accompanying drawings.

DETAILED DESCRIPTION

In the following description, numerous specific details are set forth in order to provide a thorough understanding of the present disclosure. It will be apparent, however, to one skilled in the art that embodiments of the present disclosure may be practiced without some or all of these specific details. In other instances, well known process operations have not been described in detail in order not to unnecessarily obscure the present disclosure.

Figure 1:
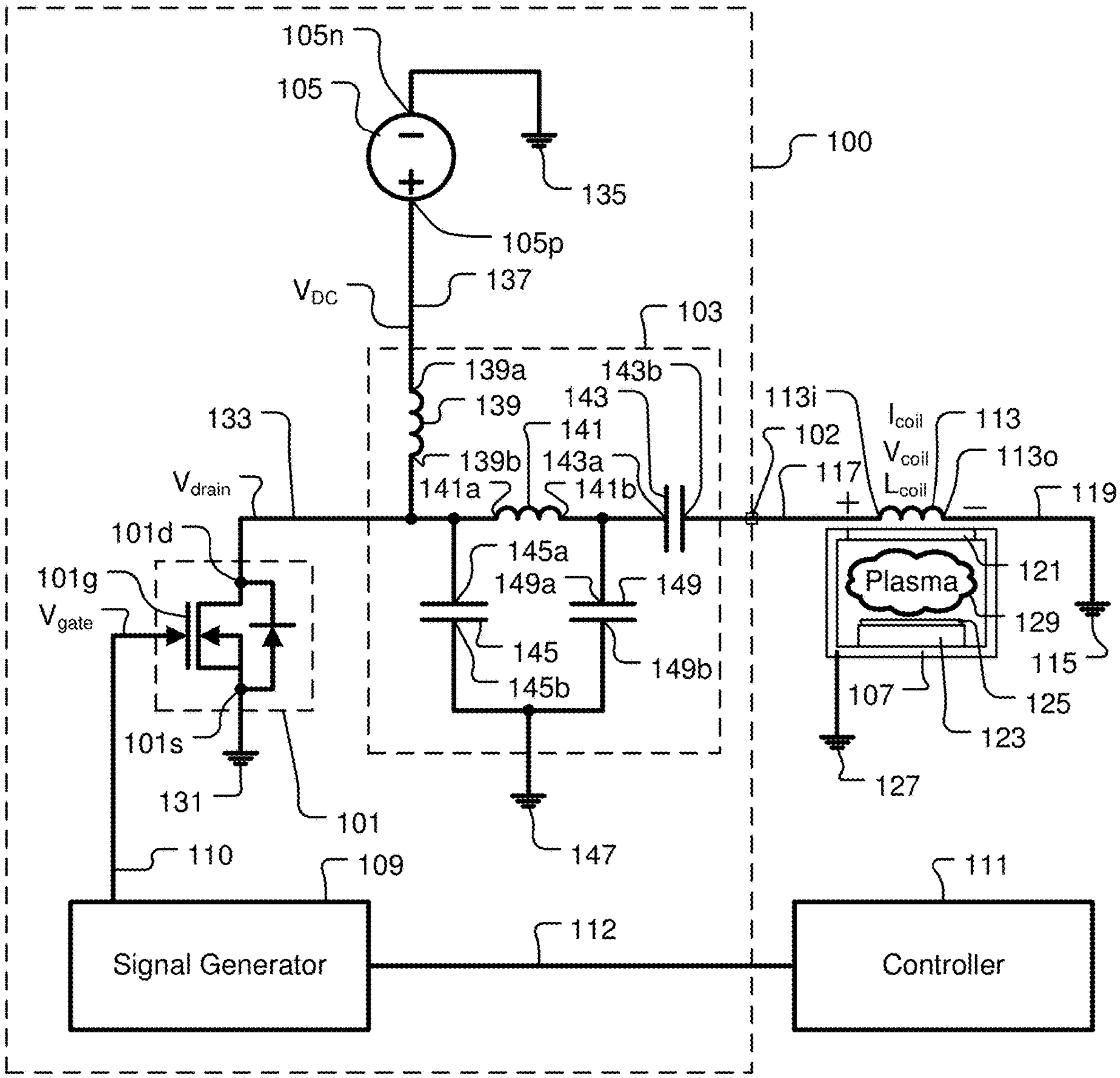
FIG. 1 shows an example configuration of an RF power amplifier, in accordance with some embodiments.

FIG. 1 shows an example configuration of an RF power amplifier 100, in accordance with some embodiments. The RF power amplifier 100 is configured to generate an RF signal and transmit the RF signal through an output 102 of the RF power amplifier 100. The output 102 of the RF power amplifier 100 is electrically connected to an input terminal 113*i* of a coil 113 through a connection 117. An output terminal 1130 of the coil 113 is electrically connected to a reference ground potential 115 through a connection 119. The coil 113 is disposed over a window 121 of a plasma processing chamber 107. The plasma processing chamber 107 includes a substrate support structure 123 configured to support a substrate 125 undergoing plasma processing within the plasma processing chamber 107. In various embodiments, the window 121 is formed of a dielectric material, such as quartz or other similar material, that allows RF power to be transmitted from the coil 113 through the window 121 and into the plasma processing chamber 107. The plasma processing chamber 107 is electrically connected to a reference ground potential 127.

As the RF power is transmitted into and through the plasma processing chamber 107, the RF power transforms a process gas into a plasma 129 within the plasma processing chamber 107 in exposure to the substrate 125 that is supported on a substrate support structure 123. The RF power amplifier 100 injects high voltage and high current to the coil 113 in order to drive the plasma 129. In various embodiments, the plasma 129 is used to provide controlled modification of a condition of the substrate 125, such as through material deposition and/or material removal and/or material implantation and/or material modification, etc. Also, in some embodiments, the plasma 129 is generated to provide for cleaning of the plasma processing chamber 107. During operation of the plasma processing chamber 107, exhaust gases and by-product materials from processing of the substrate 125 are exhausted from the plasma processing chamber 107.

It should be understood that in various embodiments operation of the plasma processing chamber 107 can include many other additional operations, such as generating a bias voltage at the substrate 125 level to attract or repel electrically charged constituents of the plasma 129 toward or away from the substrate 125, and/or controlling a temperature of the substrate 125, and/or applying additional RF power to one or more electrode(s) disposed within the substrate support structure 123 to generate additional plasma, among other additional operations. Also, in various embodiments, the plasma processing chamber 107 is operated in accordance with a prescribed recipe that specifies a temporal schedule for controlling one or more of: supply of process gas(es) to the plasma processing chamber 107, pressure and temperature within the plasma processing chamber 107, supply of RF power to the coil 113, supply of bias voltage at the substrate 125 level, supply of RF power to electrode(s) within the substrate support structure 123, among essentially any other process parameter associated with operation of the plasma processing chamber 107.

The RF power amplifier 100 is configured to generate RF signals having a prescribed waveform as a function of time, and deliver the generated RF signals to the coil 113. The RF power amplifier 100 includes a signal generator 109, a switching transistor 101, a direct current (DC) power supply 105, and an impedance matching network 103. The DC power supply 105 is implemented in conjunction with the switching transistor 101 to generate the RF signal used to drive the plasma 129. The switching transistor 101 has a source terminal 101*s*, a drain terminal 101*d*, and a gate 101*g*. The source terminal 101*s* is electrically connected to a reference ground potential 131. The drain terminal 101*d* is electrically connected to a switching transistor drain node 133, which is an electrical connection between the switching transistor 101 and the impedance matching network 103. The switching transistor drain node 133 is electrically connected to the impedance matching network 103. The DC power supply 105 has a negative terminal electrically connected to a reference ground potential 135 and a positive terminal 105*p* electrically connected to the impedance matching network 103 through a connection 137.

The impedance matching network 103 includes an first inductor 139 that has an input terminal 139*a* electrically connected to the positive terminal 105*p* of the DC power supply 105 through the connection 137. The first inductor 139 also has an output terminal 139*b* electrically connected to the switching transistor drain node 133. The impedance matching network 103 also includes a second inductor 141 that has an input terminal 141*a* and an output terminal 141*b*. The input terminal 141*a* of the second inductor 141 is electrically connected to the switching transistor drain node 133. The impedance matching network 103 also includes a first capacitor 143 that has an input terminal 143*a* electrically connected to the output terminal 141*b* of the second inductor 141. The first capacitor 143 also has an output terminal 143*b* electrically connected to the output 102 of the RF power amplifier 100. The impedance matching network 103 also includes a second capacitor 145 that has an input terminal 145*a* electrically connected to the switching transistor drain node 133. The second capacitor 145 also has an output terminal 145*b* electrically connected to a reference ground potential 147. The impedance matching network 103 also includes a third capacitor 149 that has an input terminal 149*a* electrically connected to both the output terminal 141*b* of the second inductor 141 and the input terminal 143 of the first capacitor 143. The third capacitor 149 also has an output terminal 149*b* electrically connected to the reference ground potential 147.

The signal generator 109 is configured to generate and output an oscillating square wave signal on an electrical connection 110 that is electrically connected to the gate 101*g* of the switching transistor 101. In this manner, the oscillating square wave signal output by the signal generator 109 controls the operation of the switching transistor 101. Specifically, when the oscillating square wave signal has a sufficiently high voltage level at the gate 101*g*, the switching transistor 101 turns on such that electrical current flows from the switching transistor drain node 133 to the reference ground potential 131. Also, when the oscillating square wave signal has a sufficiently low voltage level at the gate 101*g*, the switching transistor 101 turns off such that electrical current does not flow from the switching transistor drain node 133 to the reference ground potential 131. In this manner, the switching transistor 101 functions similar to an NMOS transistor.

Figure 2:
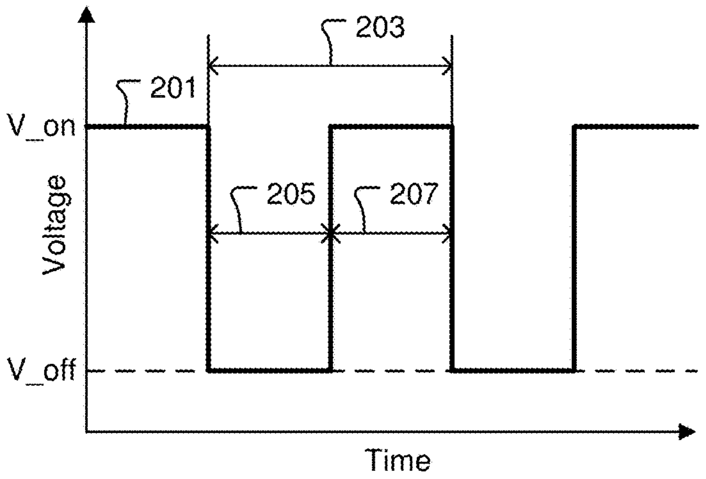
FIG. 2 shows a voltage versus time plot of an example oscillating square wave signal output by the switching transistor, in accordance with some embodiments.

FIG. 2 shows a voltage versus time plot of an example oscillating square wave signal 201 output by the switching transistor 101, in accordance with some embodiments. The oscillating square wave signal 201 has a cycle 203 that includes an off-duration 205 and an on-duration 207. During the off-duration 205, the voltage of the oscillating square wave signal 201 is sufficiently low (V_off) at the gate 101*g* to cause the switching transistor 101 to turn off, such that electrical current does not flow from the switching transistor drain node 133 to the reference ground potential 131. During the on-duration 207, the voltage of the oscillating square wave signal 201 is sufficiently high (V_on) at the gate 101*g* to cause the switching transistor 101 to turn on, such that electrical current does flow from the switching transistor drain node 133 to the reference ground potential 131. A frequency of the oscillating square wave signal 201 is defined as a number of the cycles 203 that occur within one second. In some embodiments, the controller 111 provides a frequency input setting to the signal generator 109 over an electrical connection 112. In various embodiments, the frequency input setting is an RF value. For example in some embodiments, the frequency input setting is about 2 MHz or about 13 MHz, or another target frequency.

Figure 3A:
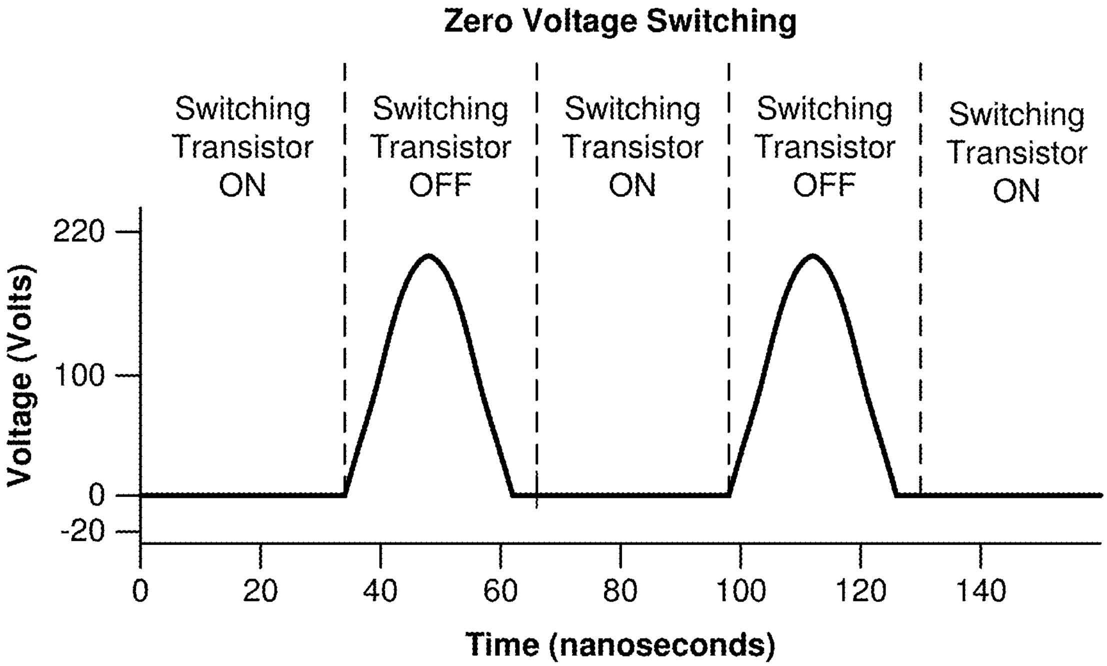
FIG. 3A shows an example plot of voltage at the switching transistor drain node as a function of time, in accordance with some embodiments.

FIG. 3A shows an example plot of voltage at the switching transistor drain node 133 as a function of time, in accordance with some embodiments. When the switching transistor 101 is on, the voltage at the switching transistor drain node 133 is zero because the switching transistor 101 is functioning to effectively short the switching transistor drain node 133 to the reference ground potential 131. When the switching transistor 101 is turned off, the voltage at the switching transistor drain node 133 increases and then decreases because of the resonant behavior of the impedance matching network 103. The temporal switching behavior of the switching transistor 101 as shown in FIG. 3A represents a condition referred to as zero voltage switching (ZVS). Specifically, the ZVS condition exists when the voltage on the switching transistor drain node 133 is resonantly reduced back to zero (or near zero) each time the switching transistor 101 is switched off and before the switching transistor 101 is switched back on by the oscillating square wave signal output by the signal generator 109. It is desirable to maintain the ZVS condition because the electrical current that flows from the switching transistor drain node 133 through the switching transistor 101 (in the on state) to the reference ground potential 131 is minimized when the voltage on the switching transistor drain node 133 is zero (or near zero). The ZVS condition is advantageous because it minimizes power loss at the switching transistor 101 and optimizes the operational lifetime of the switching transistor 101.

Figure 3B:
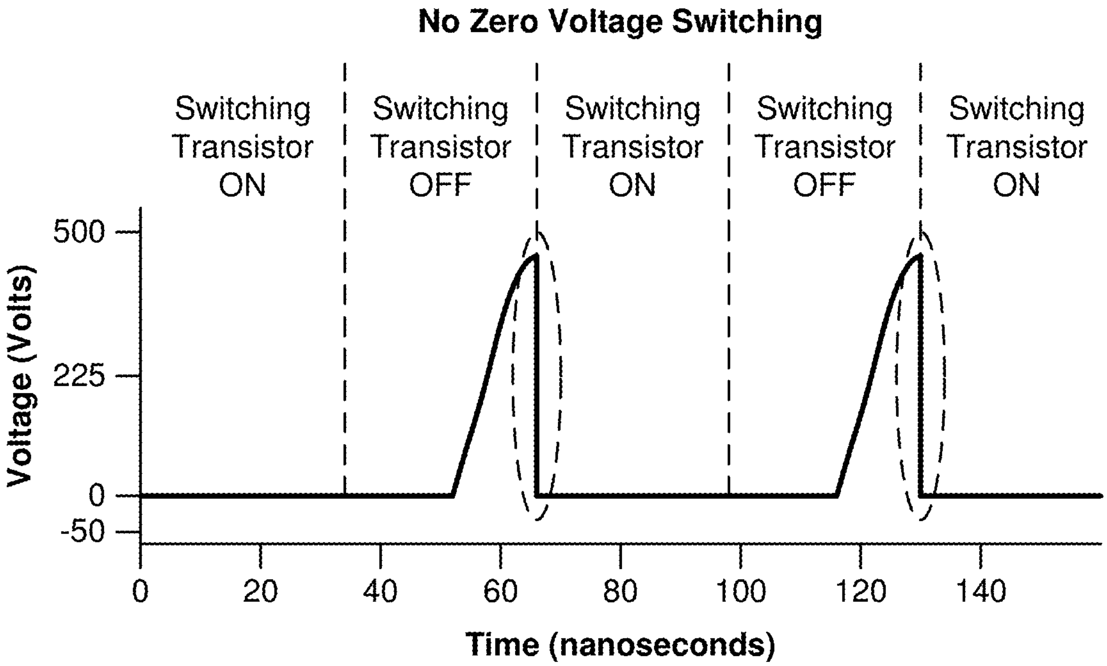
FIG. 3B shows an example plot of voltage at the switching transistor drain node as a function of time when the ZVS condition is not present, in accordance with some embodiments.

FIG. 3B shows an example plot of voltage at the switching transistor drain node 133 as a function of time when the ZVS condition is not present, in accordance with some embodiments. Changes in an inductance of the coil 113 (coil inductance), such as caused by changes in the plasma 129 load, can affect the temporal voltage behavior at the switching transistor drain node 133, which can cause loss of the ZVS condition. The coil inductance is a load inductance that is presented by the coil 113 and the plasma 129 combined. For example, consider that an initial situation exists in which the oscillating square wave signal output by the signal generator 109 has a frequency of 11 MHz, and the plasma 129 is being generated with a coil inductance of 1700 nH (nanohenries), and the ZVS condition is present. Then, consider that a perturbation occurs in the plasma 129, such as an E-to-H transition or a change in plasma density or other plasma change, such that the coil inductance changes from 1700 nH to 1500 nH. The perturbed situation causes a change in the temporal voltage behavior at the switching transistor drain node 133, such that it takes longer for the voltage on the switching transistor drain node 133 to settle back to zero (or near zero) after the switching transistor 101 is switched off. However, in the perturbed situation, the oscillating square wave signal output by the signal generator 109 is not changed and continues to have the frequency of 11 MHz. In this example perturbed situation, such as depicted in FIG. 3B, the switching transistor 101 will be controlled to switch back on when the voltage on the switching transistor drain node 133 is not zero, and possible at a high voltage, which corresponds to loss of the ZVS condition.

The ZVS condition does not exist when the oscillating square wave signal output by the signal generator 109 causes the switching transistor 101 to switch on before the voltage on the switching transistor drain node 133 has settled back to zero (or near zero) following the switching off of the switching transistor 101. If the voltage on the switching transistor drain node 133 is high when the switching transistor 101 is switched on, such as shown in FIG. 3B, there will be a substantial electrical current flow from the switching transistor drain node 133 through the switching transistor 101 to the reference ground potential 131. This flow of electrical current through the switching transistor 101 causes significant power loss at the switching transistor 101, which can lead to overheating and failure of the switching transistor 101. Therefore, if the switching frequency of the switching transistor 101 within the RF power amplifier 100 is not adjusted when the plasma 129 is going through a change that causes a change in the coil inductance, then the ZVS condition will be lost and the switching transistor 101 will overheat and eventually be damaged. Therefore, it is necessary to control the switching frequency of the switching transistor 101 of the RF power amplifier 100 to maintain the ZVS condition and correspondingly maintain minimal power loss through the switching transistor 101 in order to avoid overheating and associated hardware damage. In the above-mentioned example, if the frequency of the oscillating square wave signal output by the signal generator 109 were adjusted from 11 MHz to 11.7 MHz in response to the change in the plasma 129 that reduced the coil inductance from 1700 nH to 1500 nH, then the ZVS condition would be maintained, such as shown in FIG. 3A.

Figure 4:
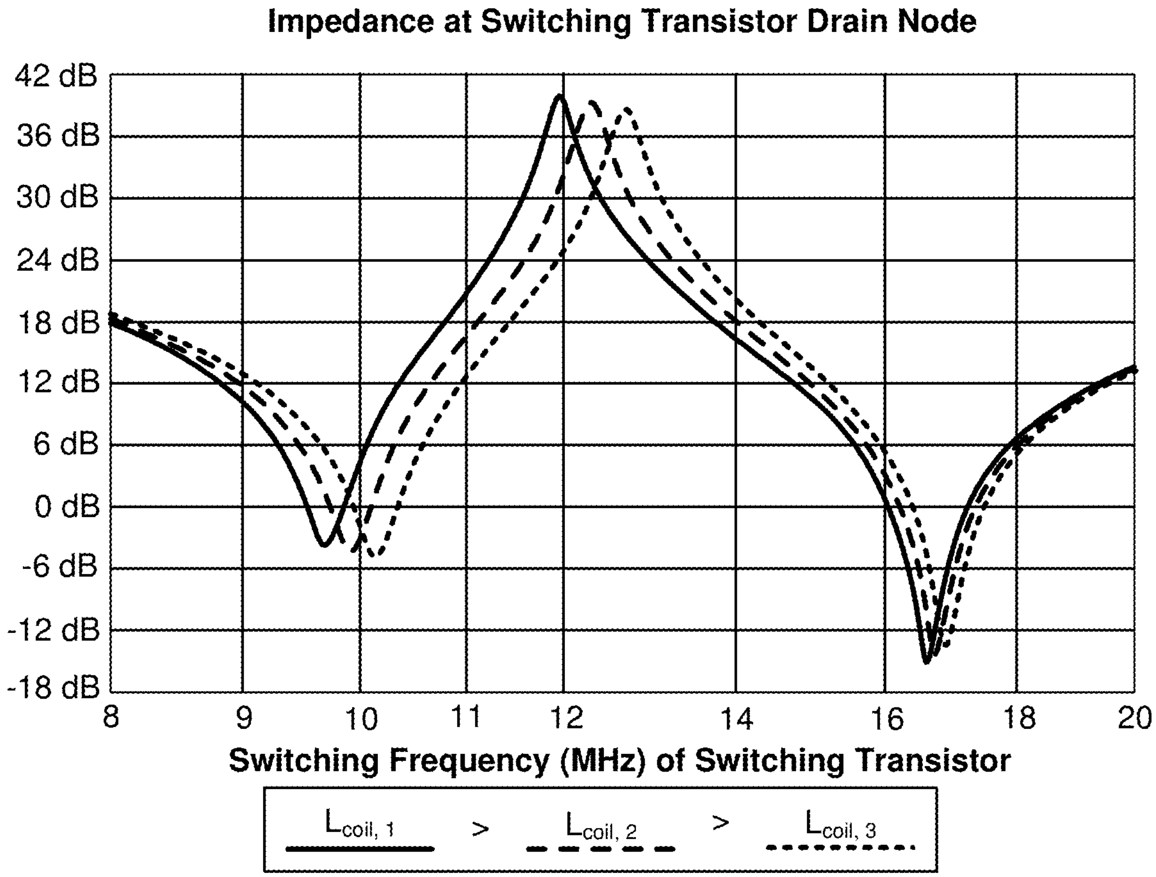
FIG. 4 shows plots of impedance at the switching transistor drain node as a function of the switching frequency of the switching transistor for different coil inductances, in accordance with some embodiments.

FIG. 4 shows plots of impedance at the switching transistor drain node 133 as a function of the switching frequency of the switching transistor 101 for different coil inductances, in accordance with some embodiments. FIG. 4 shows that as the coil inductance decreases, the plots of the impedance at the switching transistor drain node 133 versus the switching frequency of the switching transistor 101 shift toward a higher switching frequency of the switching transistor 101. Also, conversely, FIG. 4 shows that as the coil inductance increases, the plots of the impedance at the switching transistor drain node 133 versus the switching frequency of the switching transistor 101 shift toward a lower switching frequency of the switching transistor 101. In order to maintain the ZVS condition, a substantially constant impedance should be maintained at the switching transistor drain node 133. Therefore, when the coil inductance increases, the switching frequency of the switching transistor 101 should be reduced to maintain the ZVS condition. Conversely, when the coil inductance decreases, the switching frequency of the switching transistor 101 should be increased to maintain the ZVS condition. Generally speaking, a smaller coil inductance calls for a higher switching frequency of the switching transistor 101 in order to maintain the ZVS condition, and vice-versa.

When the RF power amplifier 100 drives the plasma 129 (inductively coupled plasma (ICP)), it is often challenging to maintain the ZVS condition because of the rapidly changing load impedance presented by the plasma 129 during E-to-H transition, or because of operation of the RF power amplifier 100 in a pulsing mode, or because of instabilities of electronegative plasma 129 which cause the plasma 129 to rapidly pulsate, among other causes. Also, a change in plasma 129 density can cause a change in the effective inductance of the coil 113, which in turn shifts the frequency control bandwidth in which the RF power amplifier 100 can maintain the ZVS condition. The frequency control bandwidth of the RF power amplifier 100 should be 100 kHz or higher to ensure reliable operation under various plasma 129 processing conditions, because the timescale of changes in the plasma 129 density can be as fast as 10 microseconds. Microcontroller-based or FPGA-based digital control solutions for the RF power amplifier 100 are often too slow and/or too costly for achieving a sufficiently high control speed that would provide for maintaining the ZVS condition in response to such rapid changes in the plasma 129.

Systems and methods are disclosed herein for controlling the switching frequency of the switching transistor 101 within the RF power amplifier 100 under rapidly changing plasma 129 load conditions, such that the ZVS condition is maintained. The systems and methods disclosed herein realize switching frequency control that not only maintains the ZVS condition of the RF power amplifier 100, but also achieves sub-10 microsecond control speed sufficient to track essentially any plasma 129 load changes that occur during plasma processing operations on the substrate 125. The systems and methods disclosed herein achieve this performance by maintaining either a constant phase angle or a frequency-dependent phase angle between a reference signal used by the RF power amplifier 100 (switching control signal) and a characteristic signal obtained from the RF power amplifier 100 (switching feedback signal).

Figure 5:
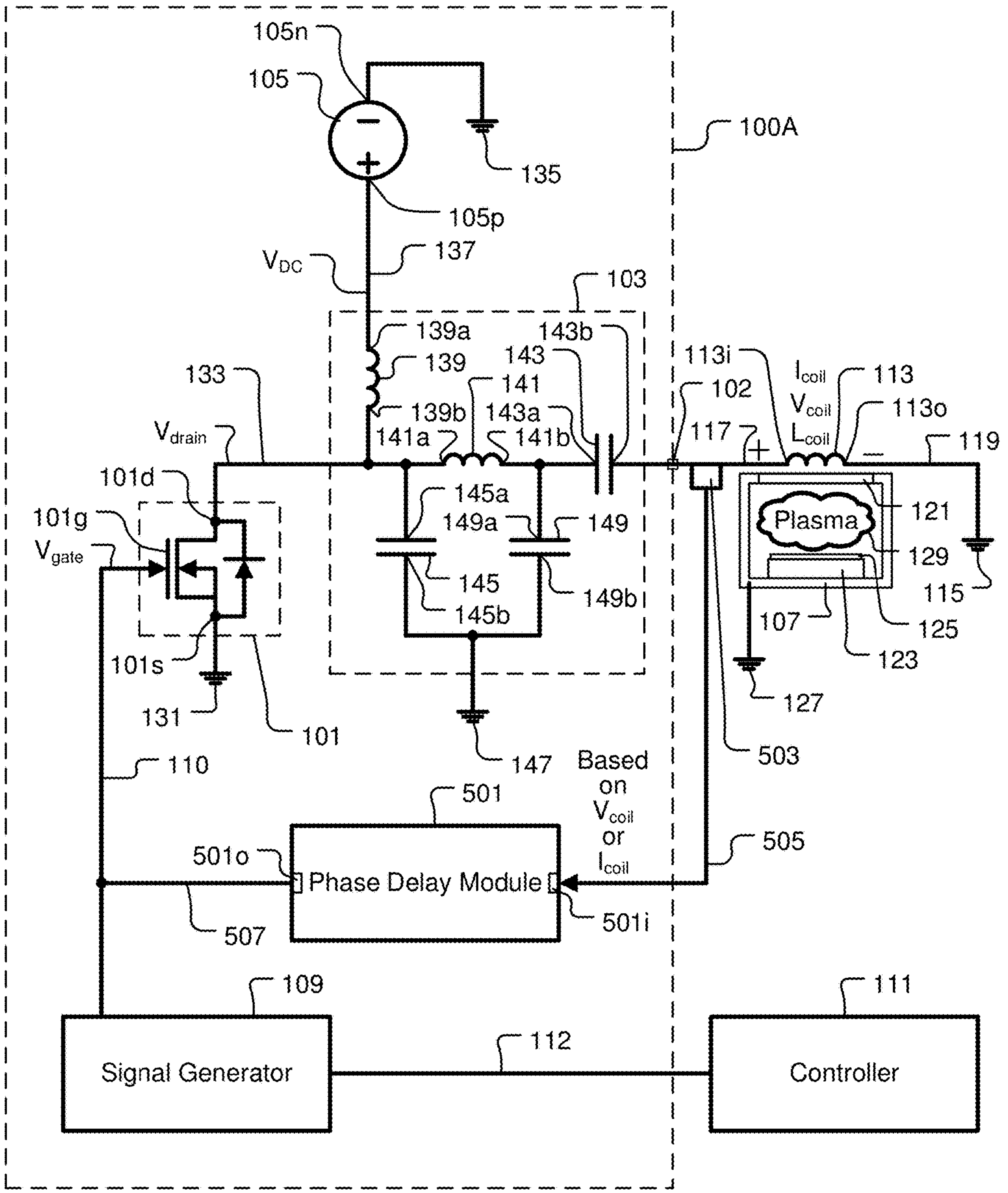
FIG. 5 shows an RF power amplifier that uses a measured electrical parameter related to the coil to generate a switching control signal that is transmitted to the gate of the switching transistor in order to maintain the ZVS condition, in accordance with some embodiments.

FIG. 5 shows an RF power amplifier 100A that uses a measured electrical parameter related to the coil 113 to generate a switching control signal that is transmitted to the gate 101*g* of the switching transistor 101 in order to maintain the ZVS condition, in accordance with some embodiments. The RF power amplifier 100A is a modification of the RF power amplifier 100. Therefore, each component in the RF power amplifier 100A that has the same reference numeral as in the RF power amplifier 100 is the same component as described with regard to the RF power amplifier 100. The RF power amplifier 100A includes an electrical parameter measurement device 503 connected to measure an electrical parameter related to the coil 113. In some embodiments, the electrical parameter measurement device 503 is configured to measure a voltage across the coil 113 ($V_{coil}$). In some embodiments, the electrical parameter measurement device 503 is configured to measure an electrical current across the coil 113 ($I_{coil}$). In some embodiments, the electrical parameter measured by the electrical parameter measurement device 503 is directly related to the coil 113, such as $V_{coil}$ and $I_{coil}$. In some embodiments, the electrical parameter measured by the electrical parameter measurement device 503 is substantially, but indirectly, related to the coil 113, such as an electrical parameter, e.g., one or more of current, voltage, and power, measured in an electrical circuit that is electrically correlated to the coil 113. For example, in some embodiments, the electrical parameter measurement device 503 is disposed to measure an electrical parameter, e.g., one or more of current, voltage, and power, at a location within the impedance matching network 103 that is electrically correlated to the coil 113.

The RF power amplifier 100A includes a phase delay module 501 having an input 501*i* connected through a connection 505 to receive a voltage signal corresponding to the electrical parameter related to the coil 113 as measured by the electrical parameter measurement device 503. The voltage signal received at the input of the phase delay module 501 is referred to as a switching feedback signal. In some embodiments, the switching feedback signal corresponds to the voltage ($V_{coil}$) measured across the coil 113. In some embodiments, the switching feedback signal corresponds to the electrical current ($I_{coil}$) measured across the coil 113. The phase delay module 501 is configured to generate the switching control signal by applying a phase delay (Q) to the switching feedback signal. The phase delay module 501 has an output 5010 connected to the gate 101*g* of the switching transistor 101 by a connection 507 and the connection 110. The switching control signal is transmitted through the output 5010 of the phase delay module 501 and through the connections 507 and 110 to the gate 101*g* of the switching transistor 101. The switching control signal output by the phase delay module 501 is used to drive the gate 101*g* and correspondingly control operation of the switching transistor 101 within the RF power amplifier 100A. In this manner, the phase delay module 501 is implemented within a feedback loop to control the switching frequency (f) of the switching transistor 101.

In the RF power amplifier 100A, the signal generator 109 is used to supply an initial oscillating square wave signal to the gate 101*g* of the switching transistor 101 in order to startup the switching operation of the switching transistor 101. Then, once the switching control signal output by the phase delay module 501 has reached an equilibrium condition corresponding to the ZVS condition, the signal generator 109 is turned off (or disconnected from the connection 110), such that operation of the switching transistor 101 is exclusively controlled by the switching control signal output by the phase delay module 501. In various embodiments, the signal generator 109 is implemented within the RF power amplifier 100A as an oscillator, or as a microcontroller, or as a direct digital synthesizer. The controller 111 provides for user control of the signal generator 109, such as by enabling setting of the initial switching frequency (f) of the switching transistor 101.

The phase delay module 501 is operated to implement a frequency tuning method (for tuning the switching frequency (f) of the switching transistor 101) that delays the measured voltage across the coil 113 ($V_{coil}$) (switching feedback signal) by the phase delay (Θ) to generate the gate 101g driving voltage (switching control signal) for the switching transistor 101. When the switching control signal output by the phase delay module 501 has reached the equilibrium condition corresponding to the ZVS condition, the state of Equation 1 exists, where $\angle V_{coil}$ is the phase angle of the voltage across the coil 113, $\angle V_{gate}$ is the phase angle of the voltage supplied to the gate 101g of the switching transistor 101, and Θ is the phase delay implemented by the phase delay module 501. Also, when the switching control signal output by the phase delay module 501 has reached the equilibrium condition corresponding to the ZVS condition, the state of Equation 2 exists, where $\angle V_{gate}$ is the phase angle of the voltage supplied to the gate 101g of the switching transistor 101, and $\angle V_{drain}$ is the phase angle of the voltage at the switching transistor drain node 133. Equations 1 and 2 are combined to obtain an equilibrium condition corresponding to the ZVS condition for the frequency tuning method as shown in Equation 3. According to Equation 3, the RF power amplifier 100A is in equilibrium and the ZVS condition is maintained when the "phase delay (Θ) versus switching frequency (f) curve" meets the "($\angle V_{coil}$−$\angle V_{drain}$)−180° versus switching frequency (f) curve." The "phase delay (Θ) versus switching frequency (f) curve" is referred to as the "theta curve." The "($\angle V_{coil}$−$\angle V_{drain}$)−180° versus switching frequency (f) curve" is referred to as the "power amp characteristic curve." Therefore, the RF power amplifier 100A is in equilibrium and the ZVS condition is maintained when the theta curve meets the power amp characteristic curve. The right hand side of Equation 3 is completely dependent on the RF power amplifier 100A design, and the left hand side of Equation 3 is completely dependent on the phase delay module 501. Therefore, it is possible to have different phase delay module 501 configurations for different RF power amplifier configurations.

$$\angle V_{coil} - \Theta = \angle V_{gate} \quad \text{Equation 1}$$

$$\angle V_{gate} - \angle V_{drain} \approx 180^\circ \quad \text{Equation 2}$$

$$\Theta = (\angle V_{coil} - \angle V_{drain}) - 180^\circ \quad \text{Equation 3}$$

Figure 6:
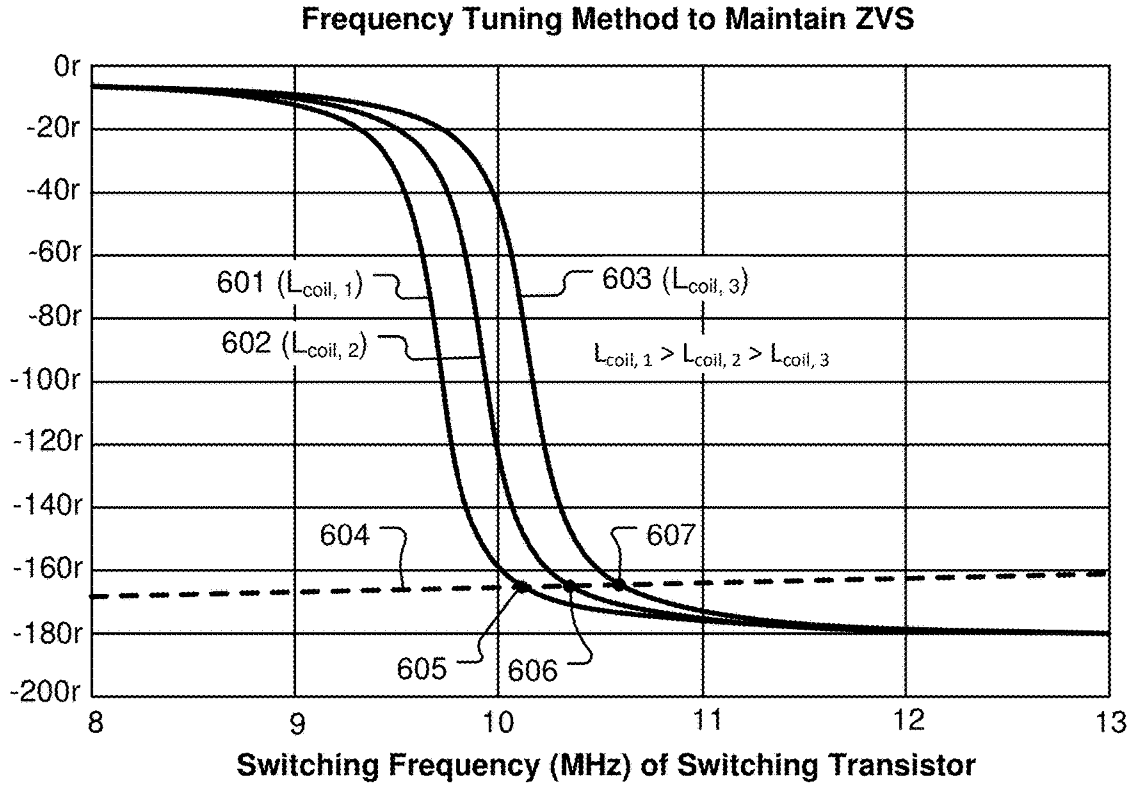
FIG. 6 shows example power amp characteristic curves for various coil inductances, along with an example theta curve, for implementing an example frequency tuning method to maintain the ZVS condition, in accordance with some embodiments.

FIG. 6 shows example power amp characteristic curves 601, 602, 603 for various coil inductances, along with an example theta curve 604, for implementing an example frequency tuning method, in accordance with some embodiments. It should be understood that the RF power amplifier 100A is operating in the ZVS condition at some points along any of the power amp characteristic curves 601, 602, and 603. For instance, in the example of FIG. 6, the RF power amplifier 100A is operating in the ZVS condition at locations on the power amp characteristic curves 601, 602, 603 to the right of the respective inflection point located near −100r. As the coil inductance decreases due to changes in the plasma 129, the power amp characteristic curve shifts toward higher frequency. Conversely, as the coil inductance increases due to changes in the plasma 129, the power amp characteristic curve shifts toward lower frequency. Essentially any point past (to the right of) the inflection point on each of the power amp characteristic curves 601, 602, and 603 can be chosen as an operating state of the RF power amplifier 100A to maintain the ZVS condition. Once operational points along the various power amp characteristic curves 601, 602, and 603 are respectively chosen to define the operation of the RF power amplifier 100A, the theta curve 604 is defined to intersect (meet) those chosen operational points along the various power amp characteristic curves 601, 602, and 603. For example, in FIG. 6, operational points 605, 606, and 607 for the RF power amplifier 100A are chosen along the power amp characteristic curves 601, 602, and 603, respectively. The theta curve 604 is defined to extend through the operational points 605, 606, and 607.

The phase delay module 501 is configured to implement the theta curve 604. Specifically, the phase delay module 501 is configured to apply the prescribed phase delay as given by the theta curve 604 to the switching feedback signal received at the input of the phase delay module 501 from the electrical parameter measurement device 503. The phase delay module 501 applies the prescribed phase delay as a function of the switching frequency (f), i.e., applies the theta curve 604, to the switching feedback signal. Therefore, as the coil inductance decreases (shifts toward higher frequency), the switching frequency (f) of the RF power amplifier 100A shifts to higher frequency in accordance with the theta curve 604, which maintains the ZVS condition. Also, conversely, as the coil inductance increases (shifts toward lower frequency), the switching frequency (f) of the RF power amplifier 100A shifts to lower frequency in accordance with the theta curve 604, which maintains the ZVS condition. Implementation of the theta curve 604 by the phase delay module 501 ensures that the RF power amplifier 100A operates in the ZVS condition as the power amp characteristic curve shifts due to changes in the coil inductance caused by changes in the plasma 129.

Figure 7:
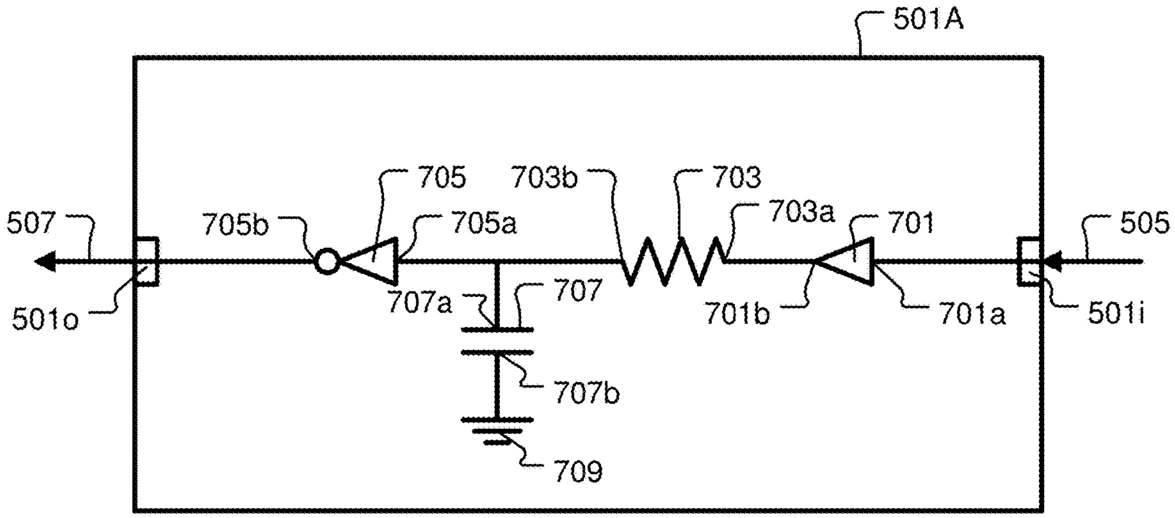
FIG. 7 shows an example configuration of a phase delay module for implementing the theta curve as shown in FIG. 6, in accordance with some embodiments.

FIG. 7 shows an example configuration of a phase delay module 501A for implementing the theta curve 604 as shown in FIG. 6, in accordance with some embodiments. In this example, the phase delay module 501A is implemented as the phase delay module 501 within the RF power amplifier 100A of FIG. 5. The phase delay module 501A includes a buffer circuit 701 having an input terminal 701a and an output terminal 701b. The input terminal 701a of the buffer circuit 701 is electrically connected to the input 501 of the phase delay module 501A. Therefore, the input terminal 701a of the buffer circuit 701 receives the switching feedback signal corresponding to measurement of the electrical parameter (either voltage, current, power, etc.) related to the coil 113. The phase delay module 501A also includes a resistor 703 having an input terminal 703a and an output terminal 703b. The input terminal 703a of the resistor 703 is electrically connected to the output terminal 701b of the buffer circuit 701. The phase delay module 501A also includes a inverter circuit 705 having an input terminal 705a and an output terminal 705b. The input terminal 705a of the inverter circuit 705 is electrically connected to the output terminal 703b of the resistor 703. The output terminal 705b of the inverter circuit 705 is electrically connected to the output 5010 of the phase delay module 501A. The phase delay module 501A also includes a capacitor 707 having an input terminal 707a and an output terminal 707b. The input terminal 707a of the capacitor 707 is electrically connected to both the output terminal 703b of the resistor 703 and the input terminal 705a of the inverter circuit 705. The output terminal 707$b$ of the capacitor 707 is electrically connected to a reference ground potential 709.

The buffer circuit 701, the resistor 703, and the capacitor 707 collectively impart a constant time delay to the switching feedback signal received at the input 501$i$ of the phase delay module 501A, such that a delayed version of the switching feedback signal is provided to the input terminal 705$a$ of the inverter circuit 705. For example, in some embodiments, the constant time delay imparted to the switching feedback signal by combination of the buffer circuit 701, the resistor 703, and the capacitor 707 is on the order of several nanoseconds. The inverter circuit 705 then imparts a 180° phase shift to the delayed version of the switching feedback signal to generate the switching control signal that is transmitted through the output 5010 of the phase delay module 501A and through the connections 507 and 110 to the gate 101$g$ of the switching transistor 101. The phase delay module 501A is configured to apply a prescribed, linearly-varying phase delay (Θ) as a function of frequency (f) (i.e., theta curve) to the switching feedback signal that corresponds to the electrical parameter related to the coil 113 as measured by the electrical parameter measurement device 503, in order to generate the switching control signal that is used to drive the gate 101$g$ of the switching transistor 101 in the RF power amplifier 100A.

In some embodiments, the phase delay module 501A is implemented in a static configuration, with the resistor 703 having a fixed resistance value and with the capacitor 707 having a fixed capacitance value. However, in some embodiments, the phase delay module 501A is implemented in a dynamic configuration, with the resistor 703 having a variable resistance value and with the capacitor 707 having a variable capacitance value. In some embodiments, in the dynamic configuration, the resistor 703 is connected to a microcontroller that provides for control of the resistance value of the resistor 703. Also, in some embodiments, in the dynamic configuration, the capacitor 707 is connected to a microcontroller that provides for control of the capacitance value of the capacitor 707.

It should be understood that the theta curve for the RF power amplifier 100A can be arbitrarily defined as needed. The phase delay module 501 is configured as needed to implement the arbitrarily defined theta curve. In other words, the phase delay module 501 is configured to impart a frequency-dependent phase delay/shift onto the switching feedback signal (characteristic signal of the RF power amplifier 100A) in order to generate the switching control signal that drives the gate 101$g$ of the switching transistor 101. Therefore, depending on how the theta curve is defined, the phase delay module 501 can have a variety of configurations.

The coil 113 impedance is usually very inductive (the Q factor is usually high). Therefore, the coil 113 voltage ($V_{coil}$) and the coil 113 current ($I_{coil}$) are almost always about 90° out of phase with each other, i.e., ($\angle V_{coil} - \angle I_{coil} \approx 90°$. Therefore, a 90° phase offset can be achieved by using the coil 113 current ($I_{coil}$) as the basis of the switching feedback signal instead of using the coil 113 voltage ($V_{coil}$). In this manner, in some embodiments, the switching feedback signal is based on measurement of the electrical current ($I_{coil}$) on the coil 113, rather than being based on measurement of the voltage ($V_{coil}$) across the coil 113, which imparts an approximately 90° phase shift relative to the voltage signal ($V_{coil}$) across the coil 113. The coil 113 current is usually very sinusoidal. Therefore, a zero-crossing detector is usable to extract the phase of the coil 113 current ($I_{coil}$). In these embodiments, the electrical parameter measurement device 503 measures the electrical current ($I_{coil}$) that goes through the coil 113 and outputs a voltage signal that is proportional to the coil 113 current ($I_{coil}$), where this voltage signal is used as the switching feedback signal. In these embodiments, the switching feedback signal that is input to the phase delay module 501 is a voltage signal that has substantially the same phase as the coil 113 current ($I_{coil}$). In some embodiments, the approximately 90° phase shift provided by use of the measured electrical current ($I_{coil}$) on the coil 113 as the switching feedback signal is combined with the phase delay imparted by the phase delay module 501 to implemented a prescribed theta curve. In some embodiments, if the prescribed theta curve corresponds to a substantially constant 90° phase shift relative to the voltage signal ($V_{coil}$) across the coil 113, then the phase delay module 501 is implemented to substantially pass through the switching feedback signal as the switching control signal.

Figure 8:
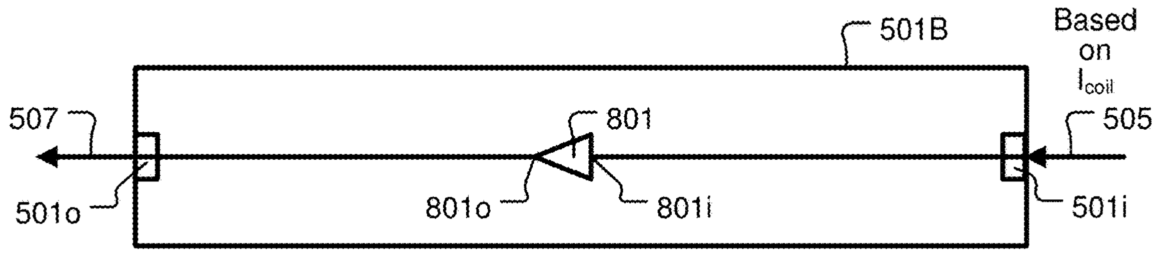
FIG. 8 shows an example of a phase delay module implemented to substantially pass through the switching feedback signal as the switching control signal, in accordance with some embodiments.

FIG. 8 shows an example of a phase delay module 501B implemented to substantially pass through the switching feedback signal as the switching control signal, in accordance with some embodiments. The phase delay module 501B includes a buffer circuit 801 having an input terminal 801$i$ electrically connected to the input 501$i$ of the phase delay module 501B, and an output terminal 8010 electrically connected to the output 5010 of the phase delay module 501B. The buffer circuit 801 boosts the switching feedback signal to generate the switching control signal, such that the switching control signal has substantially the same phase as the switching feedback signal.

Figure 9:
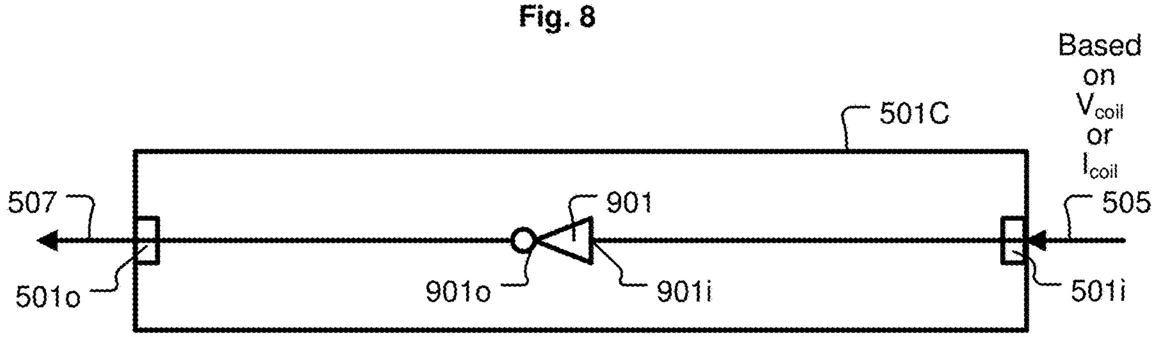
FIG. 9 shows an example of a phase delay module implemented to impart an approximately 180° phase shift to the switching feedback signal as received at the input of the phase delay module, in accordance with some embodiments.

FIG. 9 shows an example of a phase delay module 501C implemented to impart an approximately 180° phase shift to the switching feedback signal as received at the input 501$i$ of the phase delay module 501C, in accordance with some embodiments. The phase delay module 501C includes an inverter circuit 901 having an input terminal 901$i$ electrically connected to the input 501$i$ of the phase delay module 501C, and an output terminal 9010 electrically connected to the output 5010 of the phase delay module 501C. In some embodiments, the inverter circuit 901 is implemented as a digital logic NOT gate. In some embodiments, the inverter circuit 901 is implemented as an operational amplifier. The inverter circuit 901 imparts the approximately 180° phase shift to the switching feedback signal to generate the switching control signal.

Figure 10:
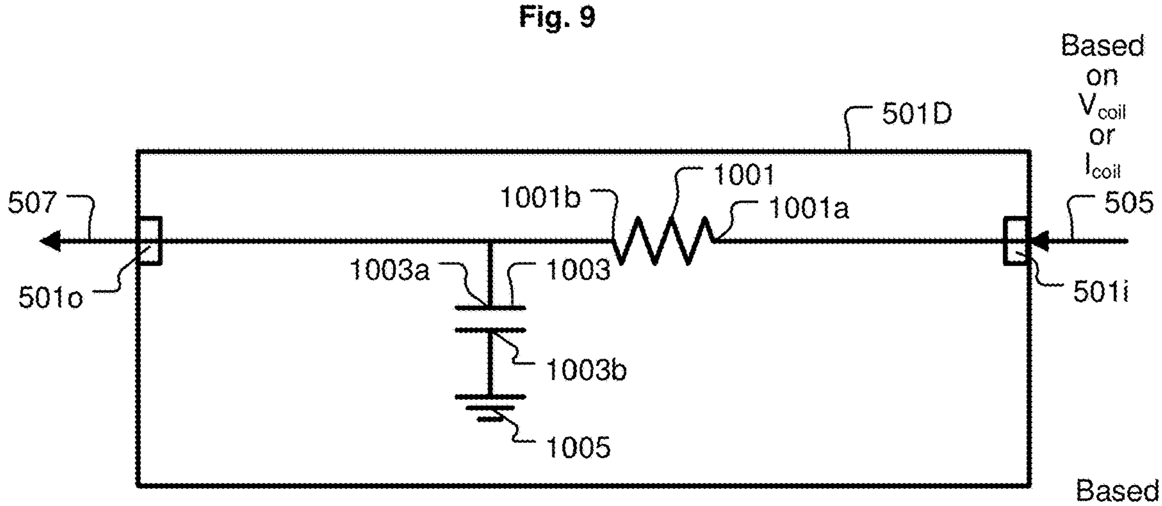
FIG. 10 shows an example of a phase delay module that implements an RC circuit to impart a fixed (and optionally adjustable) time delay to the switching feedback signal as received at the input of the phase delay module, in accordance with some embodiments.

FIG. 10 shows an example of a phase delay module 501D that implements an RC circuit to impart a fixed (and optionally adjustable) time delay to the switching feedback signal as received at the input 501$i$ of the phase delay module 501C, in accordance with some embodiments. The phase delay module 501D includes a resistor 1001 having an input terminal 1001$a$ and an output terminal 1001$b$. The input terminal 1001$a$ of the resistor 1001 is electrically connected to the input 501$i$ of the phase delay module 501D. The output terminal 1001$b$ of the resistor 1001 is electrically connected to the output 5010 of the phase delay module 501. The phase delay module 501D also includes a capacitor 1003 having an input terminal 1003$a$ and an output terminal 1003$b$. The input terminal 1003$a$ of the capacitor 1003 is electrically connected to both the output terminal 1001$b$ of the resistor 1001 and the output 5010 of the phase delay module 501. The output terminal 1003$b$ of the capacitor 1003 is electrically connected to a reference ground potential 1005. The phase delay module 501D imparts a time delay (T) to the switching feedback signal to generate the switching control signal. The time delay (T) imparted by the phase delay module 501D corresponds to a phase shift of the switching feedback signal of ($2\pi fT$). Therefore, with the phase delay module 501D, the switching control signal that is used to drive the gate 101*g* of the switching transistor 101 in the RF power amplifier 100A is a phase-shifted version of the switching feedback signal, where the phase shift amount is equal to (2πfT), and where the time delay (T) is defined by the resistance of the resistor 1001 and the capacitance of the capacitor 1003. In some embodiments, the phase delay module 501D is implemented in a static configuration with the resistor 1001 having a fixed resistance value and with the capacitor 1003 having a fixed capacitance value. In some embodiments, the phase delay module 501D is implemented in a dynamic configuration with the resistor 1001 having a variable resistance value and with the capacitor 1003 having a variable capacitance value. In these embodiments, a microcontroller (or another form of control device) is used to control the resistance value of the resistor 1001 and the capacitance value of the capacitor 1003 to impart a prescribed time delay (T) and corresponding phase shift amount (2πfT) to the switching feedback signal in order to generate the switching control signal that is supplied to the gate 101*g* of the switching transistor 101.

Figure 11:
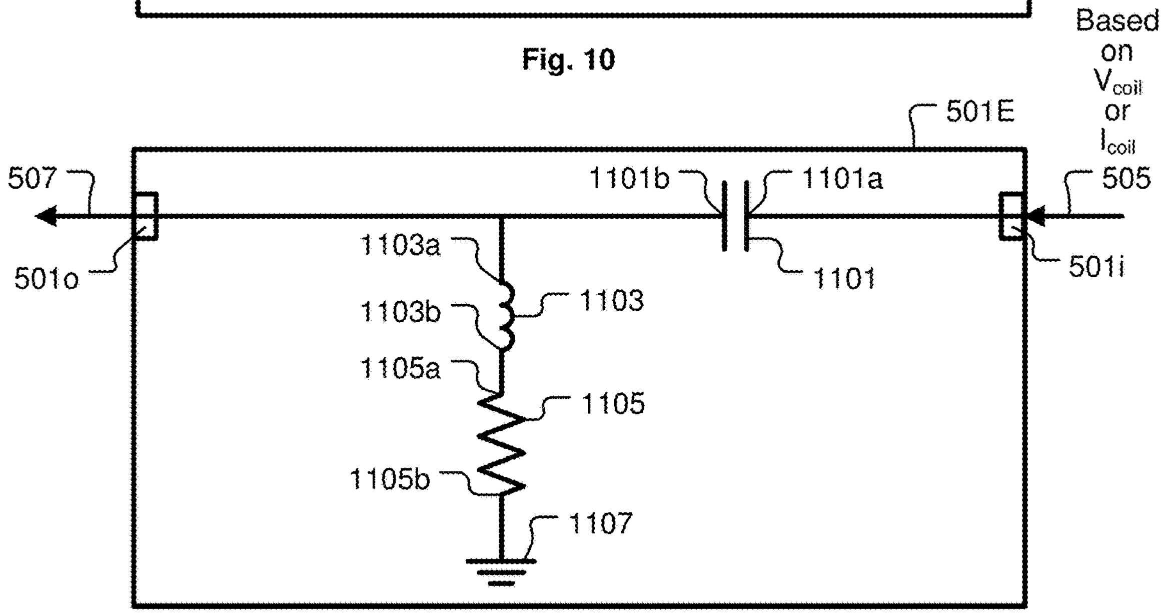
FIG. 11 shows an example of a phase delay module that implements a passive lead compensator, in accordance with some embodiments.

In some embodiments, the phase delay module 501 is configured to include an active or passive lead and/or lag compensator to implement the prescribed theta curve. For example, FIG. 11 shows an example of a phase delay module 501E that implements a passive lead compensator, in accordance with some embodiments. The passive lead compensator of the phase delay module 501E enables manipulation of a phase versus frequency profile for applying a frequency-dependent phase shift to the switching feedback signal in order to generate the switching control signal. The phase delay module 501E includes an RLC circuit that includes a resistor 1105, an inductor 1103, and a capacitor 1101. The capacitor 1101 has an input terminal 1101*a* electrically connected to the input 501*i* of the phase delay module 501E. The capacitor 1101 has an output terminal 1101*b* electrically connected to the output 5010 of the phase delay module 501E. The inductor 1103 has an input terminal 1103*a* electrically connected to both the output terminal 1101*b* of the capacitor 1101 and the output 5010 of the phase delay module 501E. The resistor 1105 has an input terminal 1105*a* electrically connected to the output terminal 1103*b* of the inductor 1103. The resistor 1105 has an output terminal 1105*b* electrically connected to a reference ground potential 1107. In some embodiments, the capacitor 1101 has a fixed capacitance value, the inductor 1103 has a fixed inductance value, and the resistor 1105 has a fixed resistance value, such that the phase delay module 501E has a static configuration that implements a static theta curve. In some embodiments, one or more of the capacitor 1101, the inductor 1103, and the resistor 1105 is adjustable/variable by way of a respective control signal from a microcontroller (or another form of control device), such that the phase delay module 501E has a dynamic configuration capable of implementing an adjustable/variable theta curve.

Figure 12:
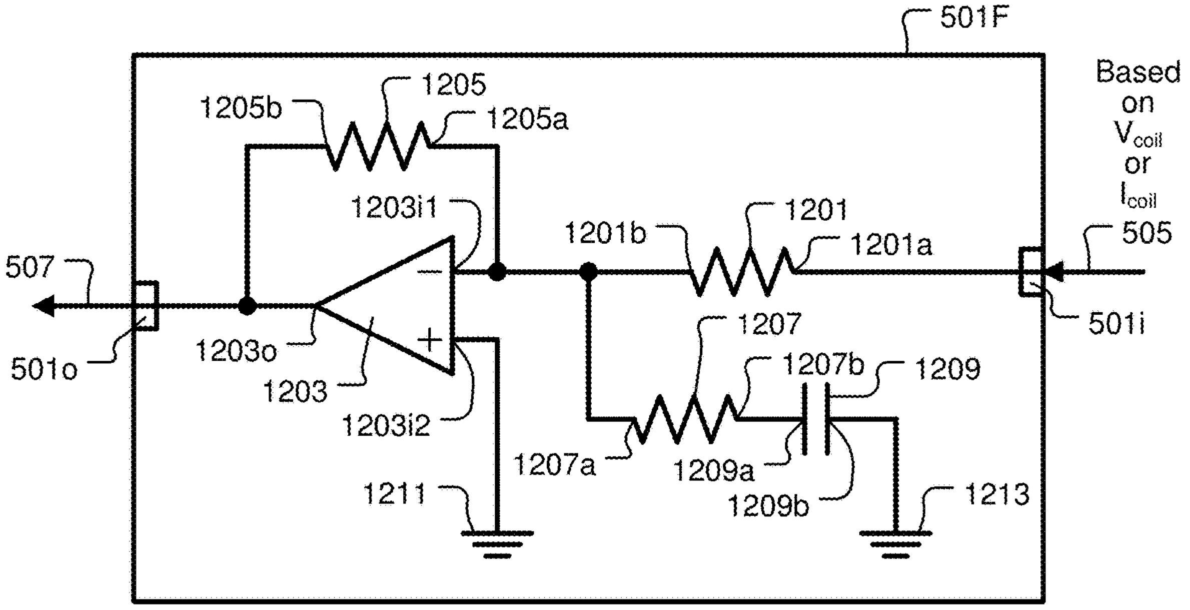
FIG. 12 shows an example of a phase delay module that implements an active lead-lag compensator, in accordance with some embodiments.

FIG. 12 shows an example of a phase delay module 501F that implements an active lead-lag compensator, in accordance with some embodiments. The phase delay module 501F includes a resistor 1201 having an input terminal 1201*a* electrically connected to the input 501*i* of the phase delay module 501F. The resistor 1201 has an output terminal 1201*b* electrically connected to each of a first input terminal 1203*i*1 (negative input terminal) of a zero crossing detector 1203, an input terminal 1205*a* of a resistor 1205, and an input terminal 1207*a* of a resistor 1207. The zero crossing detector 1203 has a second input terminal 1203*i*2 (positive input terminal) electrically connected to a reference ground potential 1211. The zero crossing detector 1203 has an output terminal 1203*o* electrically connected to both the output 501*o* of the phase delay module 501F and an output terminal 1205*b* of the resistor 1205. The resistor 1207 has an output terminal 1207*b* electrically connected to an input terminal 1209*a* of a capacitor 1209. The capacitor 1209 has an output terminal 1209*b* electrically connected to a reference ground potential 1213. In some embodiments, the resistors 1201, 1205, and 1207 have respective fixed resistance values and the capacitor 1209 has a fixed capacitance value, such that the phase delay module 501F has a static configuration that implements a static theta curve. In some embodiments, one or more of the resistors 1201, 1205, 1207 and the capacitor 1209 is adjustable/variable by way of a respective control signal from a microcontroller (or another form of control device), such that the phase delay module 501F has a dynamic configuration capable of implementing an adjustable/variable theta curve.

Figure 13A:
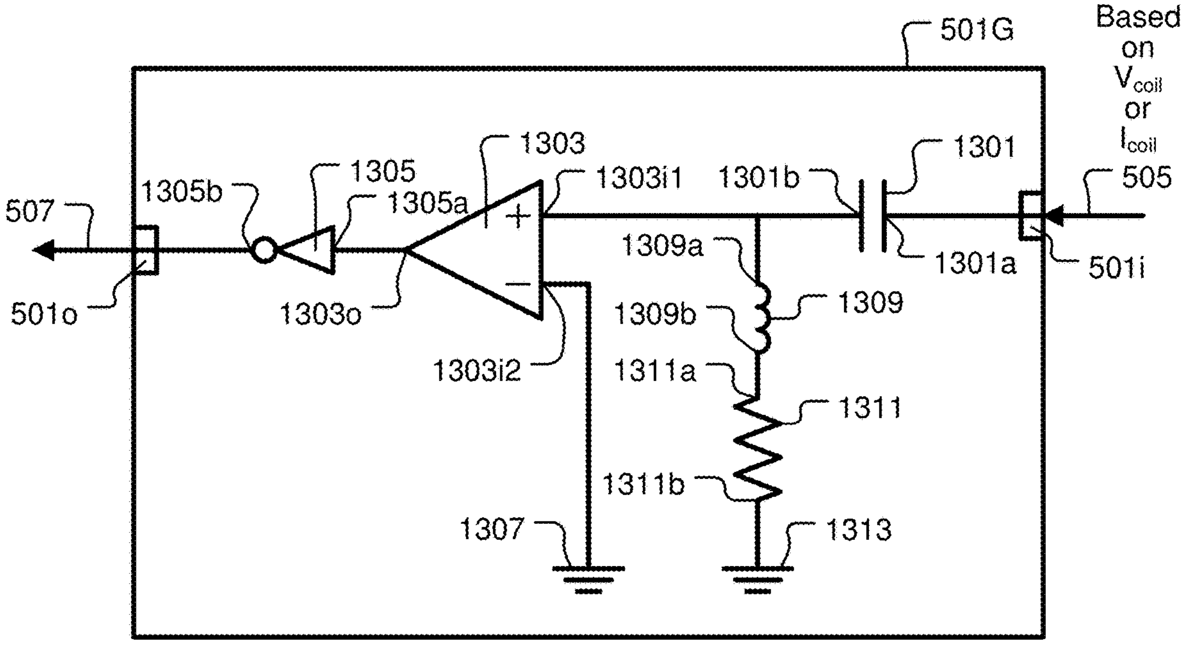
FIG. 13A shows an example of a phase delay module that implements a lead compensator, in accordance with some embodiments.

FIG. 13A shows an example of a phase delay module 501G that implements a lead compensator, in accordance with some embodiments. The phase delay module 501G includes a capacitor 1301 having an input terminal 1301*a* electrically connected to the input 501*i* of the phase delay module 501G. The capacitor 1301 has an output terminal 1301*b* electrically connected to both a first input terminal 1303*i*1 (positive input terminal) of a zero crossing detector 1303 and an input terminal 1309*a* of an inductor 1309. The zero crossing detector 1303 has a second input terminal 130312 (negative input terminal) electrically connected to a reference ground potential 1307. The zero crossing detector 1303 has an output terminal 13030 electrically connected to an input terminal 1305*a* of an inverter 1305. The inverter 1305 has an output terminal 1305*b* electrically connected to the output 5010 of the phase delay module 501G. The inductor 1309 has an output terminal 1309*b* electrically connected to an input terminal 1311*a* of a resistor 1311. The resistor 1311 has an output terminal 1311*b* electrically connected to a reference ground potential 1313. In some embodiments, the capacitor 1301, the inductor 1309, and the resistor 1311 have respective fixed configurations, such that the phase delay module 501G has a static configuration that implements a static theta curve. In some embodiments, one or more of the capacitor 1301, the inductor 1309, and the resistor 1311 is adjustable/variable by way of a respective control signal from a microcontroller (or another form of control device), such that the phase delay module 501G has a dynamic configuration capable of implementing an adjustable/variable theta curve.

Figure 13B:
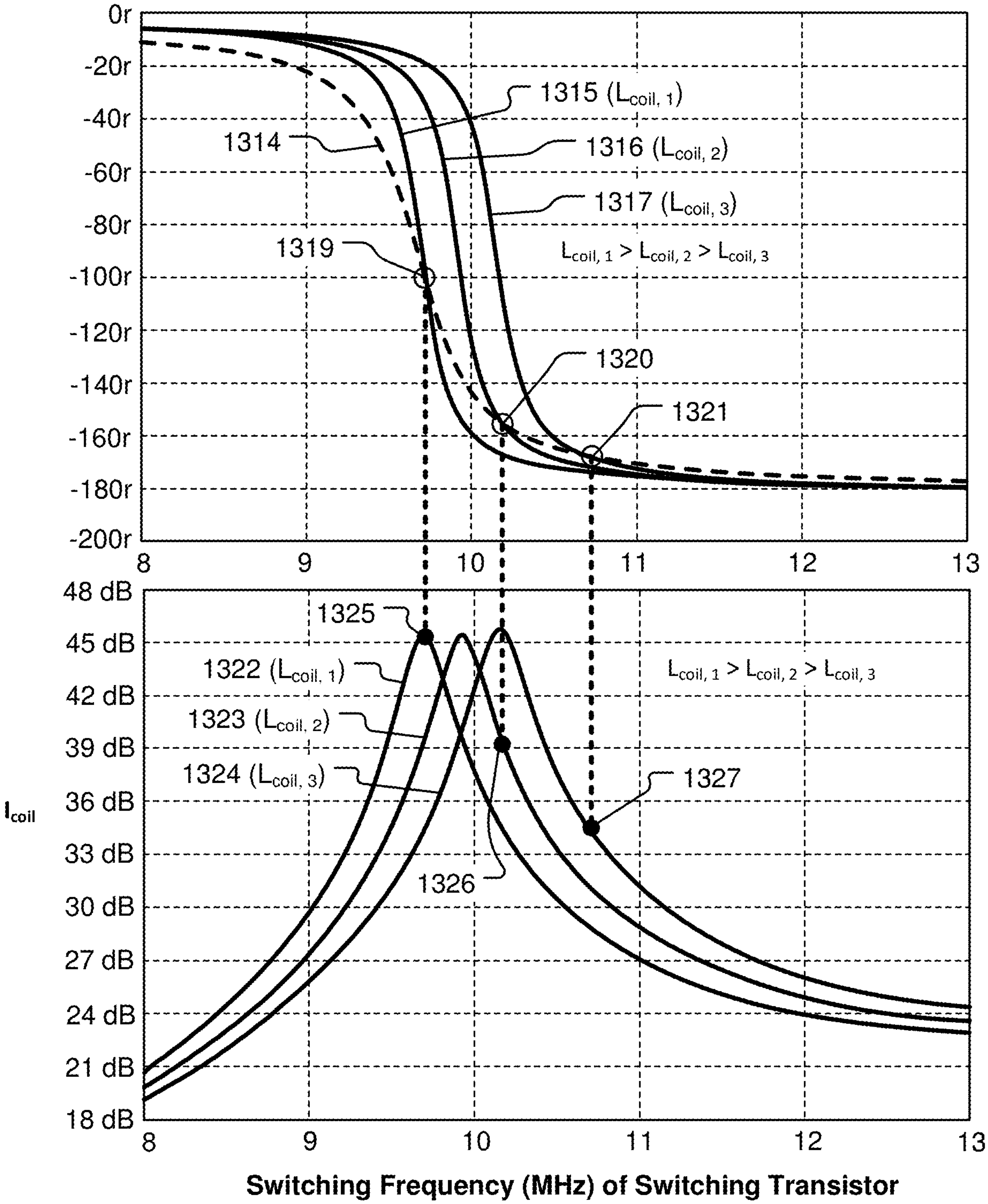
FIG. 13B shows power amp characteristic curves for different coil inductances and a theta curve implemented by the phase delay module of FIG. 13A, along with corresponding coil current responses, in accordance with some embodiments.

FIG. 13B shows power amp characteristic curves 1315, 1316, and 1317 for different coil 113 inductances $L_{coil,\ 1}$, $L_{coil,\ 2}$, and $L_{coil,\ 3}$, respectively, and a theta curve 1314 implemented by the phase delay module 501G of FIG. 13A, in accordance with some embodiments. The bottom plot of FIG. 13B shows the electrical current ($I_{coil}$) through the coil 113 as a function of switching frequency (f) for the power amp characteristic curves 1315, 1316, and 1317 shown in the top plot of FIG. 13B. Specifically, a curve 1322 shows the electrical current ($I_{coil}$) through the coil 113 as a function of switching frequency (f) for the power amp characteristic curve 1315 corresponding to the coil 113 inductance ($L_{coil,\ 1}$). A curve 1323 shows the electrical current ($I_{coil}$) through the coil 113 as a function of switching frequency (f) for the power amp characteristic curve 1316 corresponding to the coil 113 inductance ($L_{coil,\ 2}$). A curve 1324 shows the electrical current ($I_{coil}$) through the coil 113 as a function of switching frequency (f) for the power amp characteristic curve 1317 corresponding to the coil 113 inductance ($L_{coil,}$ 3). The theta curve 1314 is defined to cross the power amp characteristic curve 1315 at the operating point 1319 corresponding to the ZVS condition. The theta curve 1314 is also defined to cross the power amp characteristic curve 1316 at the operating point 1320 corresponding to the ZVS condition. The theta curve 1314 is also defined to cross the power amp characteristic curve 1317 at the operating point 1321 corresponding to the ZVS condition. The operating point 1319 corresponds to the point 1325 on the coil 113 electrical current ($I_{coil}$) curve 1322. The operating point 1320 corresponds to the point 1326 on the coil 113 electrical current ($I_{coil}$) curve 1323. The operating point 1321 corresponds to the point 1327 on the coil 113 electrical current ($I_{coil}$) curve 1324. Therefore, FIG. 13B shows that as the coil 113 inductance decreases, the phase of the switching control signal is adjusted in accordance with the theta curve 1314 so that the ZVS condition is maintained. Additionally, FIG. 13B shows that as the coil 113 inductance decreases, the electrical current ($I_{coil}$) through the coil 113 automatically decreases. This automatic control of electrical current ($I_{coil}$) through the coil 113 as a function of coil 113 inductance, while maintaining the ZVS condition is useful in some applications.

For example, in some embodiments, it is desirable to have high current at the coil 113 at startup so that the plasma 129 transitions from E mode to H mode. In some embodiments, the power amp characteristics curve 1315 corresponds to the coil inductance ($L_{coil,\ 1}$) before striking the plasma 129. The lower coil inductances ($L_{coil,\ 2}$ and $L_{coil,\ 3}$) indicates that there is some plasma 129 close to the window 121 below the coil 113, which indicates that the plasma 129 has likely transitioned from E mode to H mode. With the plasma 129 in H mode, it is desirable to not have the RF power amplifier 100A supply full power to the coil 113, because it might overheat hardware and reduce the system's reliability. Therefore, it is desirable to have the electrical current ($I_{coil}$) through the coil 113 move away from its peak value as the coil inductance decreases. FIG. 13B shows that the theta curve 1314 implemented by the phase delay module 501G causes the electrical current ($I_{coil}$) through the coil 113 to automatically move away from its peak value as the coil 113 inductance decreases, as indicated by the points 1325, 1326, and 1327, all while maintaining the ZVS condition.

The phase delay modules 501E, 501F, and 501G, as shown in FIGS. 11, 12, and 13A, respectively, represent examples of how lead and/or lag compensators can be used to implement control of the theta curve to maintain the ZVS condition. It should be understood that in various embodiments, the phase delay module 501 can be configured to implement essentially any configuration of active lead and/or lag compensator or any configuration of passive lead and/or lag compensator.

Figure 14:
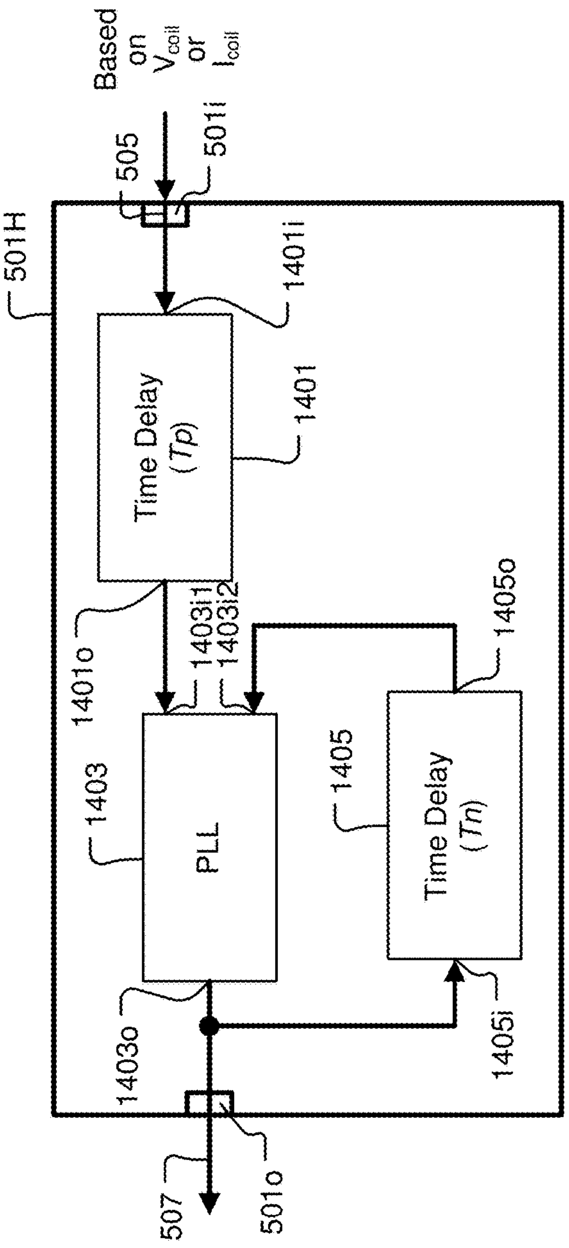
FIG. 14 shows an example of a phase delay module that implements a phase-locked loop (PLL) to impart a negative time delay to the switching feedback signal in order to generate the switching control signal, in accordance with some embodiments.

FIG. 14 shows an example of a phase delay module 501H that implements a phase lock loop (PLL) 1403 in order to impart a negative time delay to the switching feedback signal in order to generate the switching control signal, in accordance with some embodiments. The phase delay module 501H includes a time delay component 1401 having an input terminal 1401*i* electrically connected to the input 501*i* of the phase delay module 501H. The time delay component 1401 has an output terminal 1401*o* electrically connected to a first input terminal 1403*i*1 of the PLL 1403. The time delay component 1401 is configured to impart a time delay (Tp) to the signal received at the input terminal 1401*i* and convey the corresponding delayed signal through the output 1401*o*. The PLL 1403 has an output terminal 1403*o* electrically connected to the output 501*o* of the phase delay module 501H. The output terminal 1403*o* of the PLL 1403 is also electrically connected through a feedback loop to a second input terminal 1403*i*2 of the PLL 1403. The feedback loop includes a time delay component 1405. Specifically, the output terminal 1403*o* of the PLL 1403 is electrically connected to an input terminal 1405*i* of the time delay component 1405. The time delay component 1405 has an output terminal 1405*o* electrically connected to the second input terminal 1403*i*2 of the PLL 1403. The time delay component 1403 is configured to impart a time delay (Tn) to the signal received at the input terminal 1405*i* and convey the corresponding delayed signal through the output 1405*o*. In this manner, the phase delay module 501H operates to delay the switching feedback signal received at the input 501*i* by a time delay amount of (Tp−Tn), which corresponds to a phase shift amount of ($2\pi f\cdot(Tp-Tn)$), in order to generate the switching control signal that is conveyed through the output 501*o*. The phase delay module 501H provides for application of a negative time delay, which can be useful if the theta curve needs to be shifted in phase-space in order to shift the desired operating points of the RF amplifier module 100A. It should be understood that in various embodiments, the phase delay module 501 can be configured to implement a delay-locked loop (DLL) or a PLL with a delay line in the feedback loop of the DLL/PLL to impart essentially any amount of positive constant time delay or negative constant time delay to the switching feedback signal in order to generate the switching control signal.

Figure 15:
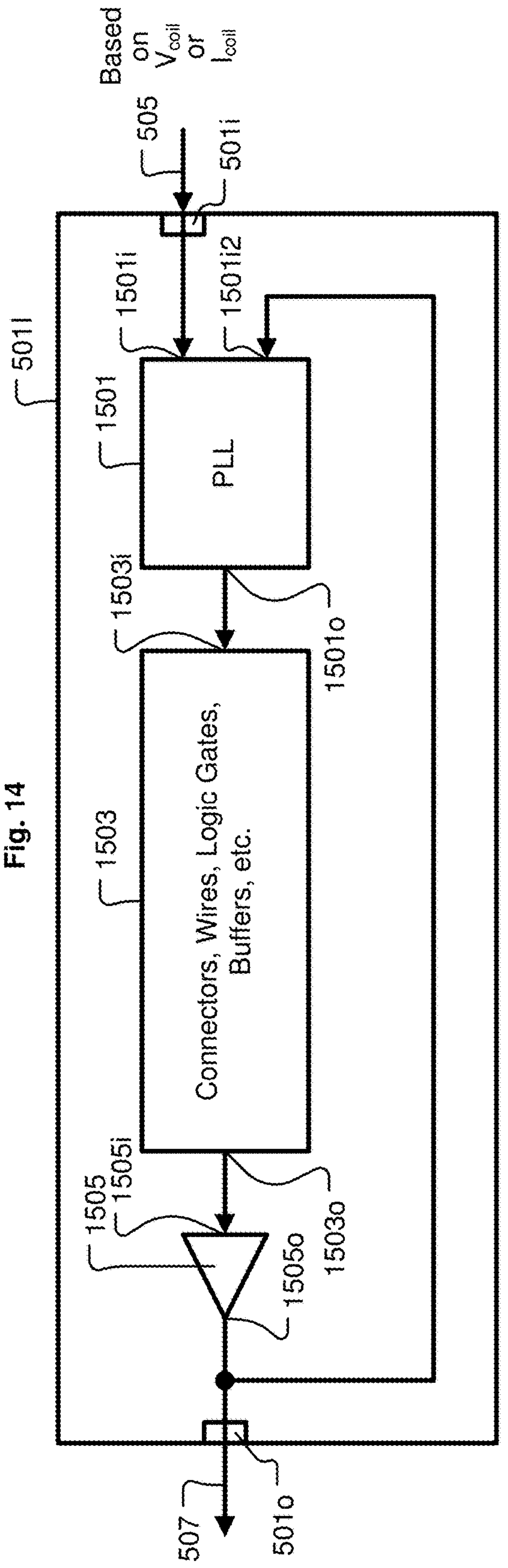
FIG. 15 shows an example of a phase delay module that implements a PLL to cancel out the signal propagation delay of the switching feedback signal in order to generate the switching control signal, in accordance with some embodiments.

FIG. 15 shows an example of a phase delay module 501I that implements a PLL 1501 to cancel out the signal propagation delay of the switching feedback signal in order to generate the switching control signal, in accordance with some embodiments. The PLL 1501 has a first input terminal 1501*i* electrically connected to the input 501*i* of the phase delay module 501I. The PLL 1501 has an output terminal 15010 electrically connected to an input terminal 1503*i* of a theta curve generation circuit 1503. In various embodiments, the theta curve generation circuit 1503 can include essentially any combination of connectors, wires, logic gates, buffers, etc., as needed to implement a prescribed theta curve. The theta curve generation circuit 1503 has an output terminal 1503*o* electrically connected to an input terminal 1505*i* of a buffer circuit 1505. The buffer circuit 1505 has an output terminal 1505*o* electrically connected to both the output 501*o* of the phase delay module 501I and a second input terminal 1501*i*2 of the PLL 1501. There is some amount of time delay between when the switching feedback signal is measured by the electrical parameter measurement device 503 and when the switching control signal reaches the gate 101*g* of the switching transistor 101. For example, in some embodiments, the total time delay from when the coil 113 voltage ($V_{coil}$) is measured to generate the switching feedback signal to when the gate 101*g* of the switching transistor 101 is driven by the corresponding switching control signal is about 30 nanoseconds, which is almost one-half of a 13 MHz (megahertz) switching frequency cycle, which is a fairly long total time delay. The phase delay module 501I provides for removal of an unwanted propagation delay in the signal path from measurement of the switching feedback signal at the coil 113 to delivery of the switching control signal to the gate 101*g* of the switching transistor 101. The switching feedback signal is provided to the first input terminal 1501*i*1 of the PLL 1501, and the switching control signal is provided from the output terminal 1505*o* of the buffer circuit 1505 (or from the final electrical node that is connected to the output 501*o* of the phase delay module 501I) to the second input terminal 1501*i*2 of the PLL 1501. In this manner, the switching control signal is used as the feedback signal for the PLL 1501. The PLL 1501 operates to adjust the timing of the signal output by the PLL 1505 to compensate for phase differences between the two signals received at the inputs 1501*i*1 and 1501*i*2 of the PLL 1501, i.e., between the switching feedback signal and the switching control signal. As a result, the unwanted propagation delay in the signal path from measurement of the switching feedback signal at the coil 113 to delivery of the switching control signal to the gate 101*g* of the switching transistor 101 is substantially decreased or eliminated by the phase delay module 501I, along with the corresponding phase lag. Therefore, the phase delay module 501I effectively cancels out all of the signal propagation delay from measurement of the switching feedback signal at the coil 113 to driving of the gate 101*g* of the switching transistor 101 by the switching control signal.

Figure 16:
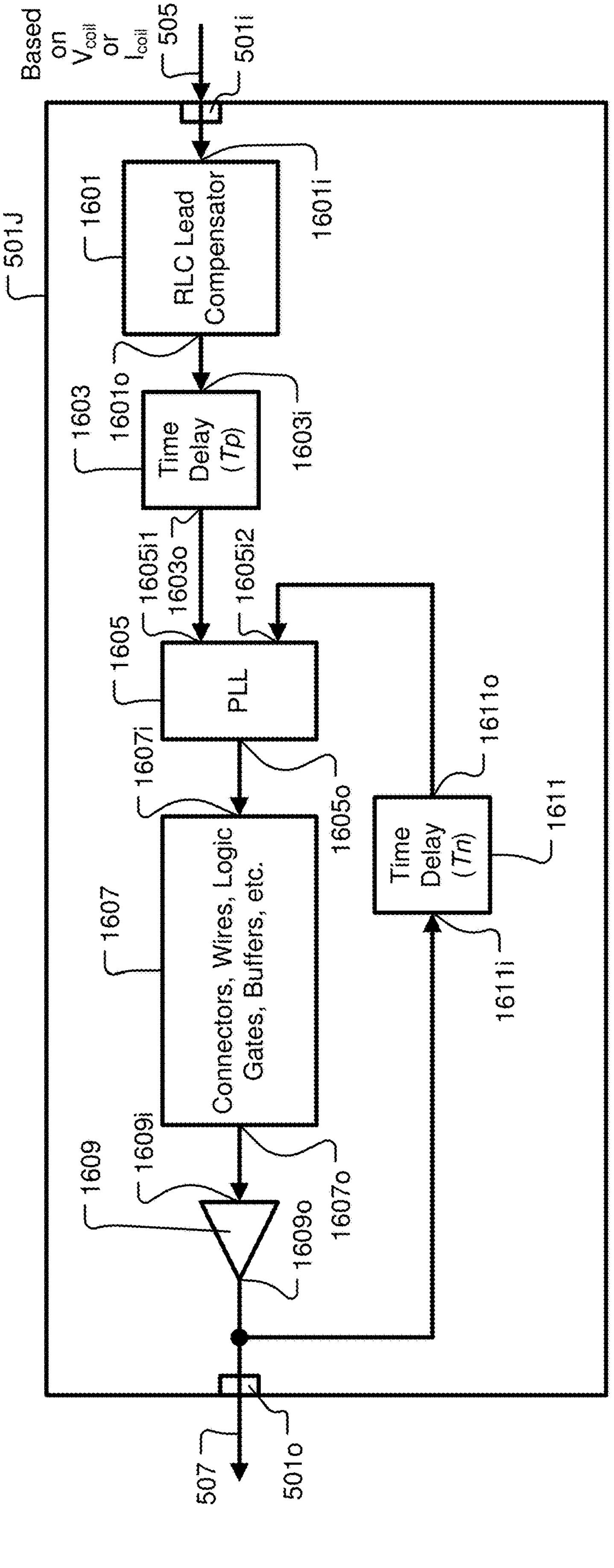
FIG. 16 shows an example of a phase delay module that combines various features of the phase delay modules as described with regard to FIGS. 7 through 15 in order to generate the switching control signal, in accordance with some embodiments.

In various embodiments, the phase delay module 501 can be implemented to combine any of the features of the phase delay modules 501A through 501I to implement a prescribed theta curve necessary for maintaining the ZVS condition. For example, FIG. 16 shows an example of a phase delay module 501J that combines various features of the phase delay modules 501A through 501I, as described with regard to FIGS. 7 through 15, in order to generate the switching control signal, in accordance with some embodiments. The phase delay module 501J includes an RLC lead compensator 1601 having an input terminal 1601*i* electrically connected to the input 501*i* of the phase delay module 501J. The RLC lead compensator 1601 has an output terminal 1601*o* electrically connected to an input terminal 1603*i* of a time delay component 1603. The time delay component 1603 has an output terminal 1603*o* electrically connected to a first input terminal 1605*i*1 of a PLL 1605. The PLL 1605 has an output terminal 1605*o* electrically connected to an input terminal 1607*i* of a theta curve generation circuit 1607. The theta curve generation circuit 1607 has an output terminal 1607*o* electrically connected to an input terminal 1609*i* of a buffer circuit 1609. The buffer circuit 1609 has an output terminal 1609*o* electrically connected to the output of the phase delay module 501. The output terminal 1609*o* of the buffer circuit 1609 is also electrically connected to an input terminal 1611*i* of a time delay component 1611. The time delay component 1611 has an output terminal 1611*o* electrically connected to a second input terminal 1605*i*2 of the PLL 1605.

The above-mentioned phase delay module 501 example configurations can be combined to create a phase shift unit of desired frequency response. For example, one may use the coil 113 voltage ($V_{coil}$) as the switching feedback signal, use a PLL for propagation delay compensation, and add a 3 nanosecond RC delay line before the input of the PLL, to create a switching control signal that leads the coil 113 current ($I_{coil}$) by 79° at 10 MHz and by 47° at 40 MHz. In this example, the phase offset varies by just 32° within the 45° to 90° degree range while the switching frequency increases by four times. In some RF power amplifier 100A configurations, this phase offset variation is small enough to maintain the ZVS condition throughout the entire frequency band. It should be understood that the foregoing phase delay module 501 descriptions are provided by way of example. In various embodiments, the phase delay module 501 is configured as needed to implement a prescribed theta curve as needed to maintain the ZVS condition over the switching frequency (f) operational range of the RF power amplifier 100A.

Figure 17:
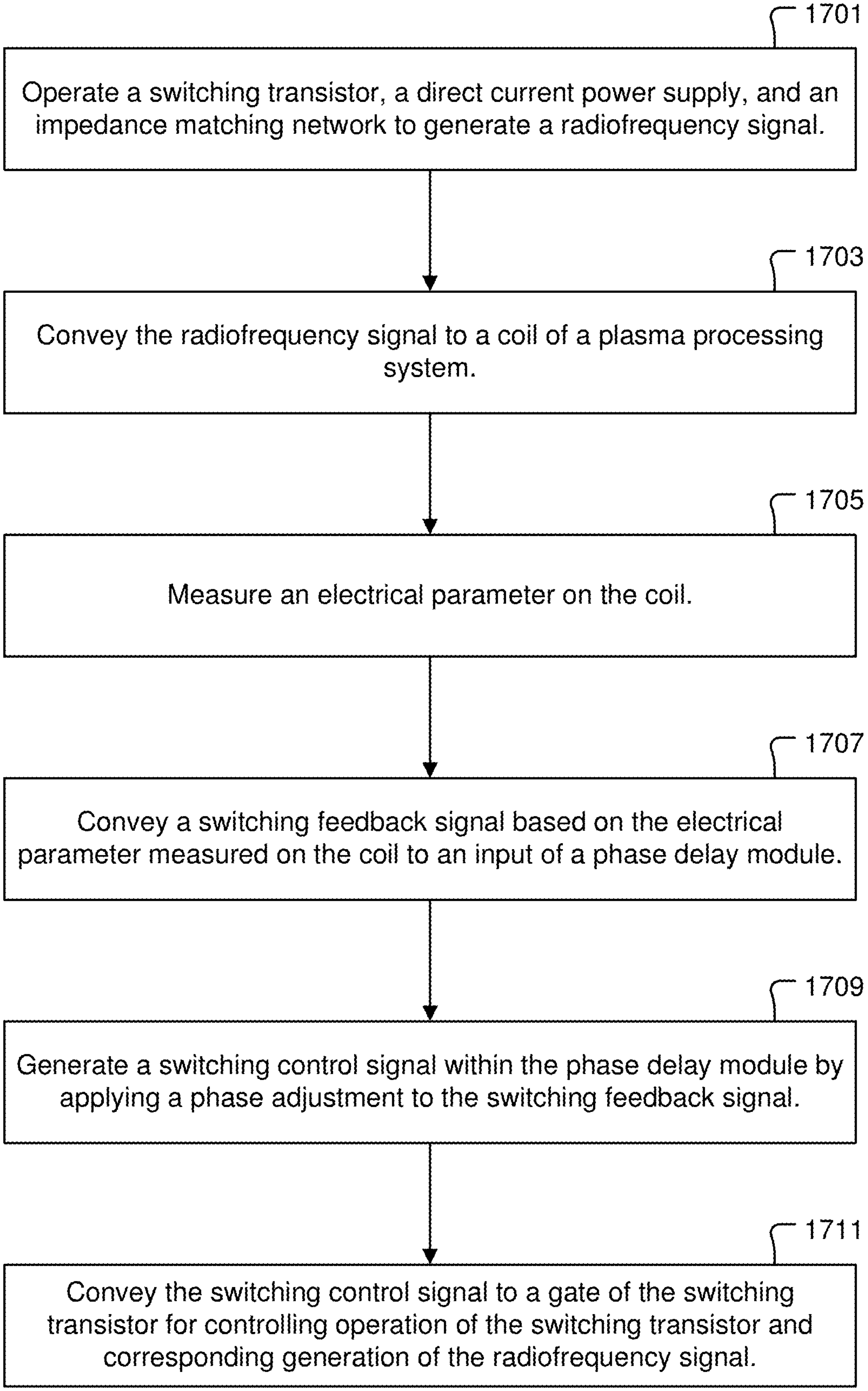
FIG. 17 shows a flowchart of a method for zero voltage switching of the RF power amplifier for a plasma processing system, in accordance with some embodiments.

FIG. 17 shows a flowchart of a method for zero voltage switching of the RF power amplifier 100A for a plasma processing system, in accordance with some embodiments. The method includes an operation 1701 for operating the switching transistor 101, the DC power supply 105, and the impedance matching network 103 to generate an RF signal. The method includes an operation 1703 for conveying the RF signal to the coil 113 of the plasma processing system. The method also includes an operation 1705 for measuring an electrical parameter related to the coil 113, such as by way of the electrical parameter measurement device 503. In some embodiments, the operation 1705 includes measuring a voltage across the coil 113. In some embodiments, the operation 1705 includes measuring an electrical current across the coil 113. The method also includes an operation 1707 for conveying a switching feedback signal based on the electrical parameter measured in the operation 1705 to the input 501*i* of the phase delay module 501. The method also includes an operation 1709 for generating a switching control signal within the phase delay module 501 by applying a phase adjustment to the switching feedback signal. The phase adjustment applied by the phase delay module 501 is represented by the theta curve discussed herein. The method also includes an operation 1711 for conveying the switching control signal to the gate 101*g* of the switching transistor 101 for controlling operation of the switching transistor 101 and corresponding generation of the RF signal that is conveyed to the coil 113. In some embodiments, the method also includes controlling the phase adjustment to maintain the ZVS condition in which the voltage on the switching transistor drain node 133 is substantially close to zero each time the switching control signal causes the switching transistor 101 to switch on to enable flow of electrical current flow between the drain terminal 101*d* of the switching transistor 101 and the reference ground potential 131.

The various embodiments disclosed herein provide for implementation of a phase shift of a characteristic signal (switching feedback signal) from an RF power amplifier. The embodiments disclosed herein provide for creation of a phase-shifting element (phase delay module 501) with a suitable frequency response, thereby achieving fast feedback control to maintain the ZVS condition of an RF power amplifier 100A over a wide plasma load impedance range. Since ZVS is needed to maintain high power efficiency and high reliability of the RF power amplifier 100A, it should be appreciated that the embodiments disclosed herein provide an inexpensive solution for enhancing the reliability and reducing the power consumption of the RF power supply system. The embodiments disclosed herein are applicable for use with any switched-mode RF power amplifier topology class.

The various embodiments described herein may be practiced in conjunction with various computer system configurations including hand-held hardware units, microprocessor systems, microprocessor-based or programmable consumer electronics, minicomputers, mainframe computers and the like. The various embodiments described herein can also be practiced in conjunction with distributed computing environments where tasks are performed by remote processing hardware units that are linked through a computer network. It should also be understood that the various embodiments disclosed herein include performance of various computer-implemented operations involving data stored in computer systems. These computer-implemented operations are those that manipulate physical quantities. In various embodiments, the computer-implemented operations are performed by either a general purpose computer or a special purpose computer. In some embodiments, the computer-implemented operations are performed by a selectively activated computer, and/or are directed by one or more computer programs stored in a computer memory or obtained over a computer network. When computer programs and/or digital data is obtained over the computer network, the digital data may be processed by other computers on the computer network, e.g., a cloud of computing resources. The computer programs and digital data are stored as computer-readable code on a non-transitory computer-readable medium. The non-transitory computer-readable medium is any data storage hardware unit, e.g., a memory device, etc., that stores data, which is thereafter readable by a computer system. Examples of the non-transitory computer-readable medium include hard drives, network attached storage (NAS), ROM, RAM, compact disc-ROMs (CD-ROMs), CD-recordables (CD-Rs), CD-rewritables (CD-RWs), digital video/versatile disc (DVD), magnetic tapes, and other optical and non-optical data storage hardware units. In some embodiments, the computer programs and/or digital data are distributed among multiple computer-readable media located in different computer systems within a network of coupled computer systems, such that the computer programs and/or digital data is executed and/or stored in a distributed fashion.

Although the foregoing disclosure includes some detail for purposes of clarity of understanding, it will be apparent that certain changes and modifications can be practiced within the scope of the appended claims. For example, it should be understood that one or more features from any embodiment disclosed herein may be combined with one or more features of any other embodiment disclosed herein. Accordingly, the present embodiments are to be considered as illustrative and not restrictive, and what is claimed is not to be limited to the details given herein, but may be modified within the scope and equivalents of the described embodiments.

What is claimed is:

1. A radiofrequency power amplifier for a plasma processing system, comprising:

a switching transistor having a drain terminal, a source terminal, and a gate, the source terminal electrically connected to a reference ground potential;

a direct current power supply electrically connected to the drain terminal of the switching transistor;

an impedance matching network electrically connected between the drain terminal of the switching transistor and a coil of the plasma processing system;

an electrical parameter measurement device disposed to measure an electrical parameter related to the coil; and a phase delay module having an input electrically connected to receive a switching feedback signal from the electrical parameter measurement device, the phase delay module configured to apply a phase adjustment to the switching feedback signal to generate a switching control signal, the phase delay module having an output electrically connected to the gate of the switching transistor, the phase delay module configured to convey the switching control signal through the output of the phase delay module to the gate of the switching transistor.

2. The radiofrequency power amplifier for the plasma processing system as recited in claim 1, wherein the electrical parameter measurement device is configured to measure a voltage across the coil and provide the switching feedback signal as a voltage signal that represents the voltage measured across the coil.

3. The radiofrequency power amplifier for the plasma processing system as recited in claim 1, wherein the electrical parameter measurement device is configured to measure an electrical current across the coil and provide the switching feedback signal as a voltage signal that represents the electrical current measured across the coil.

4. The radiofrequency power amplifier for the plasma processing system as recited in claim 1, wherein the impedance matching network includes at least one capacitor and at least one inductor.

5. The radiofrequency power amplifier for the plasma processing system as recited in claim 1, wherein the switching transistor is configured enable flow of electrical current from the drain terminal to the reference ground potential when the switching control signal applies a sufficiently high voltage to the gate of the switching transistor, and wherein the switching transistor is configured disable flow of electrical current from the drain terminal to the reference ground potential when the switching control signal applies a sufficiently low voltage to the gate of the switching transistor.

6. The radiofrequency power amplifier for the plasma processing system as recited in claim 1, wherein the phase adjustment maintains a zero voltage switching condition in which the voltage on the drain terminal of the switching transistor is substantially close to zero each time the switching control signal switches on the switching transistor to enable flow of electrical current flow between the drain terminal of the switching transistor and the reference ground potential.

7. The radiofrequency power amplifier for the plasma processing system as recited in claim 1, wherein the phase delay module includes a buffer circuit having an input terminal electrically connected to the input of the phase delay module, the phase delay module including a resistor having an input terminal electrically connected to an output terminal of the buffer circuit, the phase delay module including an inverter circuit having an input terminal electrically connected to an output terminal of the resistor, the inverter circuit having an output terminal electrically connected to the output of the phase delay module, the phase delay module including a capacitor having an input terminal electrically connected to both the output terminal of the resistor and the input terminal of the inverter circuit, the capacitor having an output terminal electrically connected to a reference ground potential.

8. The radiofrequency power amplifier for the plasma processing system as recited in claim 1, wherein the phase delay module includes a buffer circuit having an input terminal electrically connected to the input of the phase delay module, the buffer circuit having an output terminal electrically connected to the output of the phase delay module.

9. The radiofrequency power amplifier for the plasma processing system as recited in claim 1, wherein the phase delay module includes an inverter circuit having an input terminal electrically connected to the input of the phase delay module, the inverter circuit having an output terminal electrically connected to the output of the phase delay module.

10. The radiofrequency power amplifier for the plasma processing system as recited in claim 1, wherein the phase delay module includes a resistor having an input terminal electrically connected to an input of the phase delay module, the resistor having an output terminal electrically connected to the output of the phase delay module, the phase delay module including a capacitor having an input terminal electrically connected to both the output terminal of the resistor and the output terminal of the phase delay module, the capacitor having an output terminal electrically connected to a reference ground potential.

11. The radiofrequency power amplifier for the plasma processing system as recited in claim 1, wherein the phase delay module includes a capacitor having an input terminal electrically connected to the input of the phase delay module, the capacitor having an output terminal electrically connected to the output of the phase delay module, the phase delay module including an inductor having an input terminal electrically connected to both the output terminal of the capacitor and the output of the phase delay module, the phase delay module including a resistor having an input terminal electrically connected to an output terminal of the inductor, the resistor having an output terminal electrically connected to a reference ground potential.

12. The radiofrequency power amplifier for the plasma processing system as recited in claim 1, wherein the phase delay module includes a first resistor having an input terminal electrically connected to the input of the phase delay module, the phase delay module including a zero crossing detector having a first input terminal electrically connected to an output terminal of the first resistor, the zero crossing detector having a second input terminal electrically connected to a reference ground potential, the zero crossing detector having an output terminal electrically connected to the output of the phase delay module, the phase delay module including a second resistor having an input terminal electrically connected to both the output terminal of the first resistor and the first input terminal of the zero crossing detector, the second resistor having an output terminal electrically connected to both the output terminal of the zero crossing detector and the output of the phase delay module, the phase delay module including a third resistor having an input terminal electrically connected to both the output terminal of the first resistor and the first input terminal of the zero crossing detector, the phase delay module including a capacitor having an input terminal electrically connected to an output terminal of the third resistor, the capacitor having an output terminal electrically connected to the reference ground potential.

13. The radiofrequency power amplifier for the plasma processing system as recited in claim 1, wherein the phase delay module includes a capacitor having a first input terminal electrically connected to the input of the phase delay module, the phase delay module including a zero crossing detector having a first input terminal electrically connected to an output terminal of the capacitor, the zero crossing detector having a second input terminal electrically connected to a reference ground potential, the phase delay module including an inverter circuit having an input terminal electrically connected to an output terminal of the zero crossing detector, the inverter circuit having an output terminal electrically connected to the output of the phase delay module, the phase delay module including an inductor having an input terminal electrically connected to both the output terminal of the capacitor and the first input terminal of the zero crossing detector, the phase delay module including a resistor having an input terminal electrically connected to an output terminal of the inductor, the resistor having an output terminal electrically connected to the reference ground potential.

14. The radiofrequency power amplifier for the plasma processing system as recited in claim 1, wherein the phase delay module includes a first time delay component having an input terminal electrically connected to the input of the phase delay module, the phase delay module including a phase-locked loop (PLL) having a first input terminal electrically connected to an output terminal of the first time delay component, the PLL having an output terminal electrically connected to the output of the phase delay module, the phase delay module including a second time delay component having an input terminal electrically connected to both the output terminal of the PLL and the output of the phase delay module, the second time delay component having an output terminal electrically connected to a second input terminal of the PLL.

15. The radiofrequency power amplifier for the plasma processing system as recited in claim 1, wherein the phase delay module includes a phase-locked loop (PLL) having a first input terminal electrically connected to an input of the phase delay module, the phase delay module including a theta curve generation circuit having an input terminal electrically connected to an output terminal of the PLL, the phase delay module including a buffer circuit having an input terminal electrically connected to an output terminal of the theta curve generation circuit, the buffer circuit having an output terminal electrically connected to the output of the phase delay module, the PLL having a second input terminal electrically connected to both the output terminal of the buffer circuit and the output of the phase delay module.

16. The radiofrequency power amplifier for the plasma processing system as recited in claim 1, wherein the phase delay module includes a lead compensator circuit having an input terminal electrically connected to the input of the phase delay module, the phase delay module including a first time delay component having an input terminal electrically connected to an output terminal of the lead compensator circuit, the phase delay module including a phase-locked loop (PLL) having a first input terminal electrically connected to an output terminal of the first time delay component, the phase delay module including a theta curve generation circuit having an input terminal electrically connected to an output terminal of the PLL, the phase delay module including a buffer circuit having an input terminal electrically connected to an output terminal of the theta curve generation circuit, the buffer circuit having an output terminal electrically connected to the output of the phase delay module, the phase delay module including a second time delay component having an input terminal electrically connected to both the output terminal of the buffer circuit and the output of the phase delay module, the second time delay component having an output terminal electrically connected to a second input terminal of the PLL.

17. A method for zero voltage switching of a radiofrequency power amplifier for a plasma processing system, comprising:

operating a switching transistor, a direct current power supply, and an impedance matching network to generate a radiofrequency signal;

conveying the radiofrequency signal to a coil of the plasma processing system;

measuring an electrical parameter related to the coil;

conveying a switching feedback signal based on the measured electrical parameter to an input of a phase delay module;

generating a switching control signal within the phase delay module by applying a phase adjustment to the switching feedback signal; and conveying the switching control signal to a gate of the switching transistor for controlling operation of the switching transistor and corresponding generation of the radiofrequency signal that is conveyed to the coil.

18. The method as recited in claim 17, wherein measuring the electrical parameter related to the coil includes measuring a voltage across the coil.

19. The method as recited in claim 17, wherein measuring the electrical parameter related to the coil includes measuring an electrical current on the coil.

20. The method as recited in claim 17, further comprising: controlling the phase adjustment to maintain a zero voltage switching condition in which a voltage on a drain terminal of the switching transistor is substantially close to zero each time the switching control signal causes the switching transistor to switch on to enable flow of electrical current flow between the drain terminal of the switching transistor and a reference ground potential.

* * * * *